United States Patent
Liu et al.

(10) Patent No.: US 12,540,384 B2
(45) Date of Patent: Feb. 3, 2026

(54) PLASMA PROCESSING WITH TUNABLE NITRIDATION

(71) Applicant: Applied Materials, Inc., Santa Clara, CA (US)

(72) Inventors: Wei Liu, San Jose, CA (US); Shashank Sharma, Fremont, CA (US); Matthew Spuller, Belmont, CA (US); Vladimir Nagorny, Tracy, CA (US)

(73) Assignee: Applied Materials, Inc., Santa Clara, CA (US)

(*) Notice: Subject to any disclaimer, the term of this patent is extended or adjusted under 35 U.S.C. 154(b) by 751 days.

(21) Appl. No.: 17/892,968

(22) Filed: Aug. 22, 2022

(65) Prior Publication Data

US 2023/0127138 A1  Apr. 27, 2023

Related U.S. Application Data

(60) Provisional application No. 63/271,964, filed on Oct. 26, 2021.

(51) Int. Cl.
| | |
|---|---|
| *C23C 8/36* | (2006.01) |
| *C23C 8/24* | (2006.01) |
| *H01J 37/32* | (2006.01) |
| *H01L 21/02* | (2006.01) |

(52) U.S. Cl.
CPC ............... *C23C 8/36* (2013.01); *C23C 8/24* (2013.01); *H01J 37/321* (2013.01);
(Continued)

(58) Field of Classification Search
CPC .. C23C 8/36; C23C 8/24; C23C 16/24; C23C 16/36; H01J 37/321; H01J 37/32449;
(Continued)

(56) References Cited

U.S. PATENT DOCUMENTS

| | | | |
|---|---|---|---|
| 2019/0051511 A1* | 2/2019 | Kato | H01J 37/32449 |
| 2021/0202702 A1* | 7/2021 | Rogers | H01L 21/3211 |
| 2021/0269916 A1* | 9/2021 | Engler | C23C 16/45525 |

FOREIGN PATENT DOCUMENTS

| | | |
|---|---|---|
| EP | 2398042 B1 | 10/2016 |
| JP | 2001-284340 A | 10/2001 |

(Continued)

OTHER PUBLICATIONS

International Search Report and Written Opinion dated Dec. 14, 2022 for Application No. PCT/US2022/040984.

(Continued)

*Primary Examiner* — Michael G Miller
(74) *Attorney, Agent, or Firm* — Patterson + Sheridan, LLP

(57) ABSTRACT

In an embodiment, a method for nitriding a substrate is provided. The method includes flowing a nitrogen-containing source and a carrier gas into a plasma processing source coupled to a chamber such that a flow rate of the nitrogen-containing source is from about 3% to 20% of a flow rate of the carrier gas; generating an inductively-coupled plasma (ICP) in the plasma processing source by operating an ICP source, the ICP comprising a radical species formed from the nitrogen-containing source, the carrier gas, or both; and nitriding the substrate within the chamber, wherein nitriding includes operating a heat source within the chamber at a temperature from about 150° C. to about 650° C. to heat the substrate; maintaining a pressure of the chamber from about 50 mTorr to about 2 Torr; introducing the ICP to the chamber; and adjusting a characteristic of the substrate by exposing the substrate to the radical species.

20 Claims, 8 Drawing Sheets

(52) U.S. Cl.
CPC .. *H01J 37/32449* (2013.01); *H01J 37/32522* (2013.01); *H01J 37/32816* (2013.01); *H01L 21/02247* (2013.01); *H01L 21/02252* (2013.01); *H01J 2237/182* (2013.01); *H01J 2237/3387* (2013.01); *H01L 21/0214* (2013.01); *H01L 21/0217* (2013.01); *H01L 21/02181* (2013.01); *H01L 21/02189* (2013.01)

(58) Field of Classification Search
CPC ........... H01J 37/32522; H01J 37/32816; H01J 2237/182; H01J 2237/3387; H01J 37/32357; H01L 21/02247; H01L 21/02252; H01L 21/0214; H01L 21/0217; H01L 21/02181; H01L 21/02189; H01L 21/02329; H01L 21/0234
See application file for complete search history.

(56) References Cited

FOREIGN PATENT DOCUMENTS

| | | |
|---|---|---|
| JP | 2008-251959 A | 10/2008 |
| JP | 2019-125798 A | 7/2019 |
| JP | 2020-063462 A | 4/2020 |
| KR | 20150132529 A | 11/2015 |

OTHER PUBLICATIONS

Japanese Office Action dated Apr. 22, 2025 for Application No. 2024-523605.

Korean Office Action dated Jun. 13, 2025 for Application No. 10-2024-7017415.

* cited by examiner

PLASMA PROCESSING WITH TUNABLE NITRIDATION

CROSS-REFERENCES TO RELATED APPLICATIONS

This application claims benefit of and priority to U.S. Provisional Patent Application Ser. No. 63/271,964, filed on Oct. 26, 2021, which is incorporated herein by reference in its entirety.

BACKGROUND

Field

Embodiments of the present disclosure generally relate to plasma processing methods, and more specifically to radical species nitridation using plasma processing.

Description of the Related Art

Plasma processing is used in the semiconductor industry for deposition, etching, resist removal, and related processing of semiconductor substrates and other substrates. Plasma sources are often used for plasma processing to produce high density plasma and reactive species for processing substrates. Formation of plasma breaks molecules into radicals (and generates ions) which can be used to achieve substrate treatment in a chamber. Typically, a mixture of gases is fed into a plasma generation region (active zone) of an inductively coupled plasma (ICP) source, and electrons accelerated in the high electric field region ionize and dissociate this mixture, creating a new gas (plasma) having radicals and ions.

Conventional methods for nitridation include thermal and plasma-based methods. Conventional thermal methods for nitridation are typically performed at temperatures that can be detrimental to the substrate being processed. Conventional plasma-based nitridation also has drawbacks such as poor conformality of the nitride layer for high aspect ratio structures, as well as the difficulty in conformal nitridation of silicon oxide films.

There is a need for new and improved plasma processing methods for nitridation of substrates.

SUMMARY

Embodiments of the present disclosure generally relate to plasma processing methods, and more specifically to radical species nitridation using plasma processing.

In an embodiment, a method for nitriding a substrate is provided. The method includes positioning a substrate on a substrate support in a processing volume of a processing chamber, and flowing a nitrogen-containing source and a carrier gas into a plasma processing source coupled to the processing chamber such that a flow rate of the nitrogen-containing source is from about 3% to about 20% of a flow rate of the carrier gas. The method further includes generating an inductively-coupled plasma in the plasma processing source by operating an inductively-coupled plasma source at a power of about 2,000 W to about 10,000 W, the inductively-coupled plasma comprising a radical species formed from the nitrogen-containing source, the carrier gas, or both. The method further includes nitriding the substrate within the processing chamber, wherein nitriding the substrate within the processing chamber includes operating a heat source within the processing chamber at a temperature from about 150° C. to about 650° C. to heat the substrate; maintaining a pressure of the processing chamber from about 50 mTorr to about 2 Torr; introducing the inductively-coupled plasma to the processing chamber; and adjusting a nitrogen content, a number of nitrogen atoms per unit area, a nitride thickness, or combinations thereof, of the substrate by exposing the substrate to the radical species.

Embodiments can include one or more of the following. The $H_2$ can be co-flowed with the nitrogen-containing source, the inductively-coupled plasma can further include a radical species formed from the $H_2$, or combinations thereof. The plasma processing source can include a gas injection channel defined between a gas injection insert and a sidewall of the plasma processing source; and an induction coil can be positioned proximate the sidewall and horizontally overlapping the gas injection channel. Flowing the nitrogen source and the carrier gas into the plasma processing source can include flowing the nitrogen source and the carrier gas into the gas injection channel. The nitrogen-containing source can include $NH_3$, $N_2$, hydrazine ($N_2H_4$), or combinations thereof. The carrier gas can include Ar, He, Ne, Kr, Xe, or combinations thereof. The heat source can include a lamp positioned above the substrate, a lamp positioned below the substrate, a heater embedded within the substrate support, or combinations thereof. The heat source can have a plasma source output of about 2 inches in diameter to about 15 inches in diameter. The substrate can include crystalline silicon, amorphous silicon, polycrystalline silicon, crystalline SiGe, amorphous SiGe, polycrystalline SiGe, silicon oxide, silicon nitride, hafnium oxide, hafnium zirconium oxide, or combinations thereof. The method can further include performing an oxygen radical treatment before or after nitriding the substrate; performing a hydrogen radical treatment before or after nitriding the substrate; or a combination thereof. The oxygen radical treatment, the hydrogen radical treatment, or both, can be performed in the same processing chamber as nitriding the substrate.

In another embodiment, a method for nitriding a substrate is provided. The method includes positioning a substrate on a substrate support in a processing volume of a processing chamber, and generating an inductively-coupled plasma in a plasma processing source coupled to the processing chamber, wherein generating the inductively-coupled plasma comprises: operating an inductively-coupled plasma source at a power of about 2,000 W to about 10,000 W; flowing hydrazine and a carrier gas into the plasma processing source such that a flow rate of the hydrazine is from about 3% to about 100% of a flow rate of the carrier gas, the carrier gas comprising Ar, He, Ne, Kr, Xe, or combinations thereof; and forming the inductively-coupled plasma, the inductively-coupled plasma comprising a radical species comprising N, NH, or a combination thereof. The method further includes nitriding the substrate within the processing chamber, wherein nitriding the substrate comprises: operating a heat source within the processing chamber at a temperature from about 150° C. to about 650° C. to heat the substrate; maintaining a pressure of the processing chamber from about 50 mTorr to about 2 Torr; introducing the inductively-coupled plasma to the processing chamber; and adjusting a nitrogen content, a number of nitrogen atoms per unit area, a nitride thickness, or combinations thereof, of the substrate by exposing the substrate to the inductively-coupled plasma comprising the radical species.

Embodiments can include one or more of the following. The flow rate of the hydrazine can be from about 5% to about 15% of the flow rate of the carrier gas. The pressure can be from about 200 mTorr to about 1 Torr, the temperature can be from about 500° C. to about 650° C., nitriding the substrate can be performed for about 5 minutes or less, or combinations thereof. The heat source can have a plasma source output of about 2 inches in diameter to about 15 inches in diameter. $H_2$ can be co-flowed with the hydrazine and the inductively-coupled plasma can further include a radical species formed from the $H_2$. $NH_3$, $N_2$, or a combination thereof can be co-flowed with the hydrazine and the inductively-coupled plasma can further include a radical species formed from the $NH_3$, $N_2$, or a combination thereof.

In another embodiment, a method for nitriding a substrate is provided. The method includes positioning a substrate on a substrate support in a processing volume of a processing chamber, the substrate comprising silicon, and generating an inductively-coupled plasma in a plasma processing source coupled to the processing chamber, wherein generating the inductively-coupled plasma comprises: operating an inductively-coupled plasma source at a power of about 2,000 W to about 10,000 W; flowing a nitrogen-containing source and a carrier gas into the plasma processing source such that a flow rate of the a nitrogen-containing source is from about 3% to about 100% of a flow rate of the carrier gas, the carrier gas comprising Ar, He, Ne, Kr, Xe, or combinations thereof; and forming the inductively-coupled plasma, the inductively-coupled plasma comprising a radical species comprising N, NH, or a combination thereof. The method further includes nitriding the substrate within the processing chamber, wherein nitriding the substrate comprises: operating a heat source within the processing chamber at a temperature from about 150° C. to about 650° C. to heat the substrate; maintaining a pressure of the processing chamber from about 50 mTorr to about 2 Torr; introducing the inductively-coupled plasma to the processing chamber; and adjusting a nitrogen content, a number of nitrogen atoms per unit area, a nitride thickness, or combinations thereof, of the substrate by exposing the substrate to the inductively-coupled plasma comprising the radical species.

Embodiments can include one or more of the following. The substrate can include silicon germanium (SiGe). The flow rate of the nitrogen-containing source can be from about 5% to about 15% of the flow rate of the carrier gas. The pressure can be from about 200 mTorr to about 1 Torr. The temperature can be from about 500° C. to about 650° C. The nitriding the substrate can be performed for about 10 minutes or less. $H_2$ can be co-flowed with the nitrogen-containing source and the inductively-coupled plasma further comprises a radical species formed from the $H_2$. The plasma processing source can be integrated within the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to plasma processing methods, and more specifically to radical species nitridation using plasma processing. Embodiments of processes described herein can enable, for example, higher nitrogen dosing and nitride thickness of a substrate being processed with lower thermal budgets relative to conventional nitridation methods. Moreover, the methods described herein can be highly conformal in high-aspect ratio structures present on semiconductor device substrates. Further, processes described herein can be cyclic, combined with a hydrogen radical treatment, and/or combined with an oxygen radical treatment to achieve desired results. The nitridation methods can be performed in a single chamber with other processes, such as other radical treatment processes.

For purposes of the present disclosure, nitridation and nitriding are used interchangeably. For example, nitridation of a substrate also refers to nitriding a substrate. Aspects of the present disclosure are discussed with reference to a "substrate" or semiconductor wafer for purposes of illustration and discussion. Those of ordinary skill in the art, using the disclosures provided herein, will understand that the example aspects of the present disclosure can be used in association with any suitable semiconductor substrate or other suitable substrate. A "substrate support" refers to any structure that can be used to support a substrate.

Example Apparatus

Figure 1:
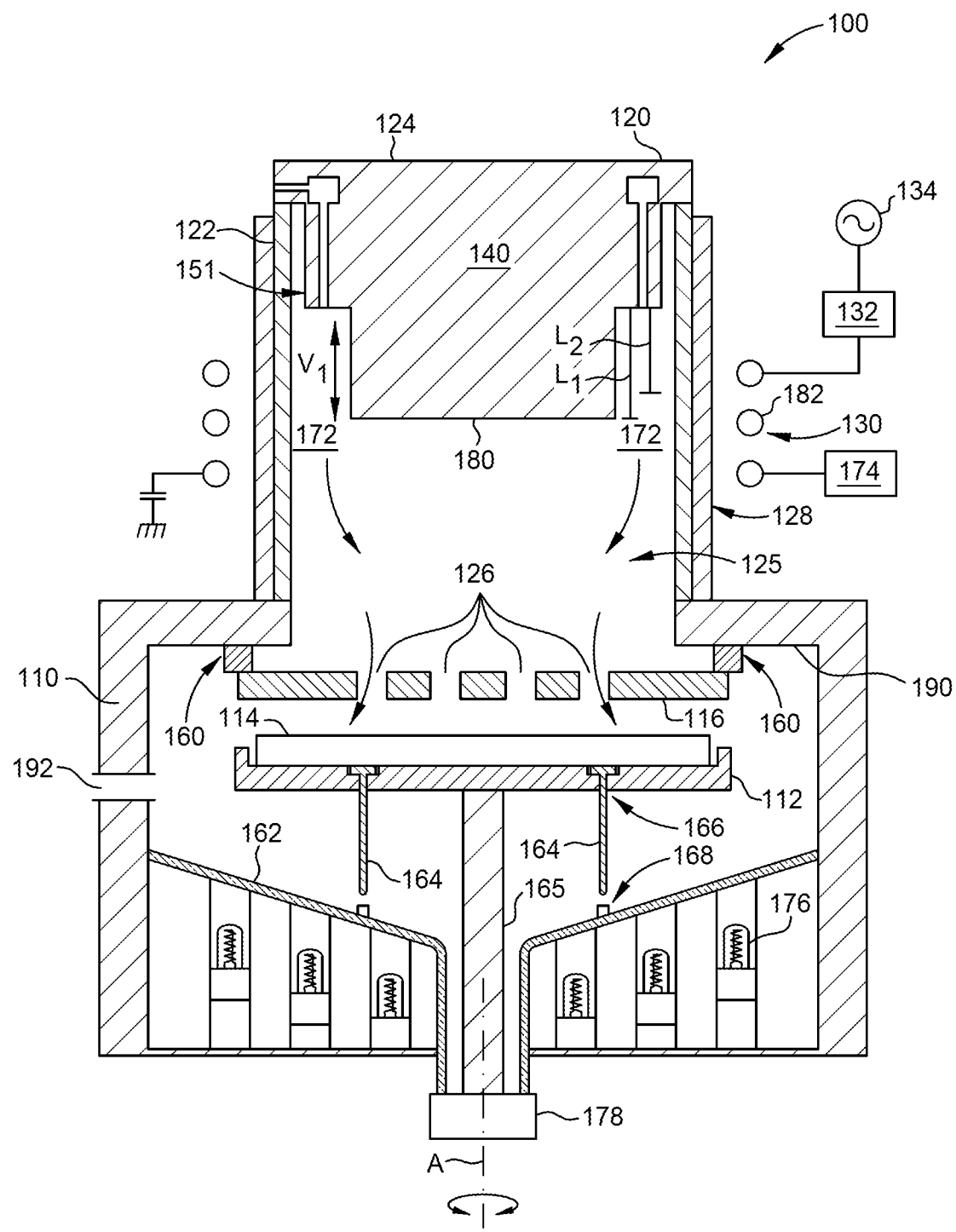
FIG. 1 is a schematic diagram of an example plasma processing apparatus according to at least one embodiment of the present disclosure.

With reference now to the FIGS., example embodiments of the present disclosure will now be set forth. FIG. 1 depicts a plasma processing apparatus 100. The plasma processing apparatus 100 includes a processing chamber 110 and a plasma source 120 coupled with the processing chamber 110. The processing chamber 110 includes a substrate support 112 operable to hold a substrate 114. In some embodiments, the substrate has a thickness that is less than about 1 mm. Substrate support 112 can be proximate one or more heat sources (for example, a plurality of lamps 176) that provide heat to a substrate during processing of the substrate in the processing chamber 110. Heat can be provided using any suitable heat source, such as one or more lamps, such as one or more rapid thermal processing lamps, or via a heated pedestal (for example, a pedestal having resistive heating elements embedded therein or coupled thereto). In operation, the heat sources enable independent temperature control of the substrate which is described in more detail below.

As shown in FIG. 1, processing chamber 110 includes window 162, such as a dome, and the plurality of lamps 176. The plurality of lamps 176 are disposed between the window 162 and a bottom wall of the processing chamber 110. The plurality of lamps 176 are positioned in an array. The plurality of lamps 176 can be arranged in a plurality of concentric rings surrounding a center of the processing chamber 110. The plurality of lamps 176 can include 100 or more lamps, such as 200 or more lamps, such as from 200 lamps to 500 lamps, such as from 200 lamps to 300 lamps, such as 240 lamps, such as from 300 lamps to 400 lamps, such from 400 lamps to 500 lamps, such as 400 lamps. The power of each of the plurality of lamps 176 is from 400 W to 1000 W, such as from 500 W to 800 W, such as from 500 W to 600 W, such as from 600 W to 700 W, such as 645 W, such as from 700 W to 800 W. A distance from the plurality of lamps 176 to the substrate is about 50 mm or less, such as from about 5 mm to about 50 mm, such as from about 5 mm to about 20 mm, such as about 12.5 mm, such as from about 20 mm to about 50 mm, such as about 36.5 mm.

A controller (not shown) is coupled to the processing chamber 110, and may be used to control chamber processes described herein including controlling the plurality of lamps 176. The substrate support 112 is disposed between a separation grid 116 and the window 162. A plurality of sensors (not shown) can be disposed proximate one or more of the lamps 176 and/or the substrate support 112 for measuring the temperature within the processing chamber 110. The plurality of sensors can include one or more infrared pyrometers or miniature pyrometers. In certain embodiments, the one or more pyrometers includes 2, 3, or 4 pyrometers. In certain embodiments, the pyrometers have a wavelength of 3.3 µm, although in general, commercial pyrometer wavelengths typically vary from about 0.5 µm to about 14 µm. In some embodiments, the pyrometers are bottom pyrometers, meaning the pyrometers are positioned below the substrate such as proximate the plurality of lamps 176.

The substrate support 112 is coupled with a shaft 165. The shaft is connected to an actuator 178 that provides rotational movement of the shaft and substrate support (about an axis A). Actuator 178 may additionally or alternatively provide height adjustment of the shaft 165 during processing.

The substrate support 112 includes lift pin holes 166 disposed therein. The lift pin holes 166 are sized to accommodate a lift pin 164 for lifting of the substrate 114 from the substrate support 112 either before or after a deposition process is performed. The lift pins 164 may rest on lift pin stops 168 when the substrate 114 is lowered from a processing position to a transfer position.

A plasma can be generated in plasma source 120 (for example, in a plasma generation region) by induction coil 130 and desired particles flow from the plasma source 120 to the surface of substrate 114 through holes 126 provided in a separation grid 116 that separates the plasma source 120 from the processing chamber 110 (a downstream region).

The plasma source 120 includes a dielectric sidewall 122. The plasma source 120 includes a top plate 124. The dielectric sidewall 122 and top plate 124, integrated with an gas injection insert 140 define a plasma source interior 125. Dielectric sidewall 122 can include any suitable dielectric material, such as quartz. An induction coil 130 is disposed proximate (for example, adjacent) the dielectric sidewall 122 about the plasma source 120. The induction coil 130 is coupled to an RF power generator 134 through any suitable matching network 132. Feed gases are introduced to the plasma source interior from a gas supply 150. When the induction coil 130 is energized with RF power from the RF power generator 134, a plasma is generated in the plasma source 120. In some embodiments, RF power is provided to induction coil 130 at about 1 kW to about 15 kW, such as about 3 kW to about 10 kW. Induction coil 130 may ignite and sustain a plasma in a wide pressure and flow range. In some embodiments, the plasma processing apparatus 100 includes a grounded Faraday shield 128 to reduce capacitive coupling of the induction coil 130 to the plasma.

To increase efficiency, the plasma processing apparatus 100 includes a gas injection insert 140 disposed in the plasma source interior 125. The gas injection channels 151 provide the process gas to the plasma source interior 125 through an active zone 172, where due to enhanced confinement of hot electrons a reaction between hot electrons and the feed gas occurs. An enhanced electron confinement region or an active zone 172 is defined by sidewalls of gas injection insert and the vacuum tube in radial direction and by the edge of the surface 180 of the insert from the bottom in vertical direction. The active zone 172 provides an electron confinement region within the plasma source interior 125 for efficient plasma generation and sustaining. The gas injection channels 151 can be narrow and prevent plasma spreading from the chamber interior into the gas injection channels 151. Gas injection channels 151 can be about 1 mm in diameter or greater, such as about 10 mm or greater, such as about 1 mm to about 10 mm. The gas injection insert 140 forces the process gas to be passed through the active zone 172 where plasma is formed.

The capabilities of the gas injection insert 140 to improve efficiency of the plasma processing apparatus 100 are independent of the material of the gas injection insert 140 as long as the walls that are in direct contact with radicals are made of material with a low recombination rate for the radicals. For instance, in some embodiments, the gas injection insert 140 can be made from a metal, such as an aluminum material, with a coating configured to reduce surface recombination. Alternatively, the gas injection insert 140 can be a dielectric material, such as a quartz material, or an insulative material.

The induction coil 130 is aligned with the active region in such a way that the top turn of the coil is above the surface 180 of the gas injection insert 140 and operates substantially in the active region of the inner volume, while the bottom turn of the coil is below surface 180 and operates substantially outside the active region. The center of the coil is substantially aligned with the surface 180. Within these boundaries one can adjust the coil position for a desired performance. Alignment of the coil with surface 180 provides improved source efficiency, namely controlled generation of desired chemical species for plasma processes and delivering them to the substrate with reduced or eliminated losses. For example, plasma sustaining conditions (balance between local generation and loss of ions) might not be the best for generating species for a plasma process. Regarding delivery of the species to the substrate, efficiency can depend on the volume and wall recombination of these particular species. Hence, control of the alignment of the coil with surface 180 provides control of the source efficiency for a plasma process.

In some embodiments, a coil has a short transition region near the leads, and the remainder of the coil turns are parallel to the surface 180, in other embodiments, a coil is helical, but one can always define the top and the bottom turn of the coil. In some embodiments, a coil can have 2-5 turns.

In some embodiments, surface 180 is aligned with a portion of induction coil 130 (for example, coil loop 182) along axis 184 by utilizing a suitably sized gas injection insert 140 (and top plate 124, which may be a preformed part of the gas injection insert 140) to form the plasma source 120. Alternatively, surface 180 can be movable along a vertical direction $V_1$ relative to plasma source 120 while a remainder portion of gas injection insert 140 is static (for example, fixed) as part of plasma source 120, in order to provide alignment of surface 180 with a portion of induction coil 130. For example, a mechanism 170 can be coupled with any suitable portion of gas injection insert 140 to adjust a position of surface 180 such that a portion of gas injection insert 140 having a first length ($L_1$) is adjusted to a second length ($L_2$). Mechanism 170 can be any suitable mechanism, such as an actuator, for example a motor, electric motor, stepper motor, or pneumatic actuator. In some embodiments, a difference in length from $L_1$ to $L_2$ is about 0.1 cm to about 4 cm, such as about 1 cm to about 2 cm.

Additionally or alternatively, the gas injection insert 140 can be coupled to a mechanism (such as mechanism 170), and mechanism 170 is configured to move the entirety of gas injection insert 140 vertically (for example, along a vertical direction $V_1$ relative to plasma source 120), in order to align surface 180 with a portion of induction coil 130. Spacers (not shown) can be used to fill gap(s) between gas injection insert 140 and another portion of plasma source 120 (such as between top plate 124 and dielectric sidewall 122) that were formed by moving the insert vertically. The spacers may be formed from, for example, a ceramic material, such as a quartz.

In general, positioning the induction coil 130 center above surface 180 will increase the efficiency of ionization and dissociation, but reduces the transport efficiency of these species to the substrate, as many of the species may recombine on the walls of the narrow active region. Positioning the induction coil 130 below surface 180 can improve plasma delivery efficiency, but may decrease plasma generation efficiency.

Figure 6A:
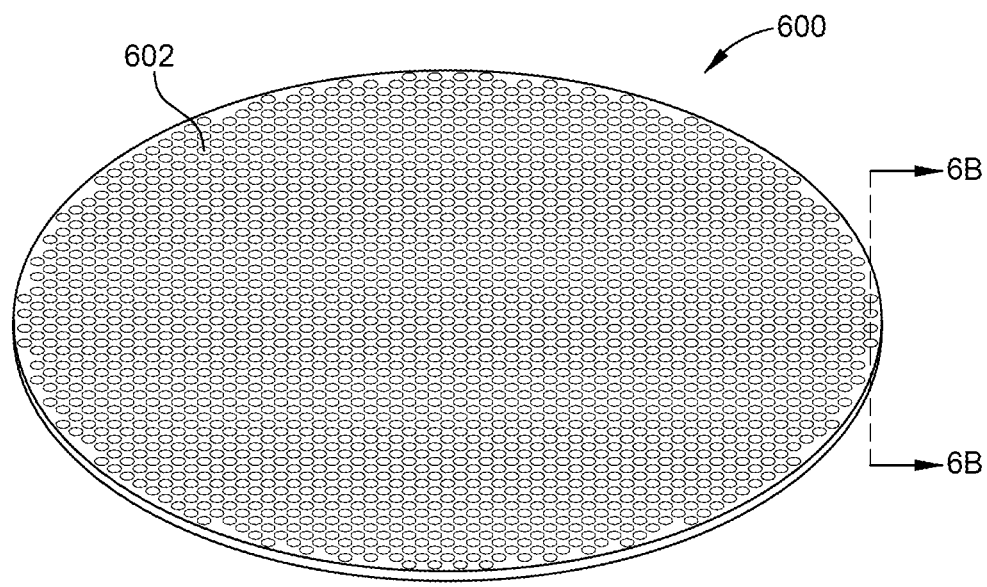
FIG. 6A is an isometric view of an example separation grid according to at least one embodiment of the present disclosure.
Figure 6B:
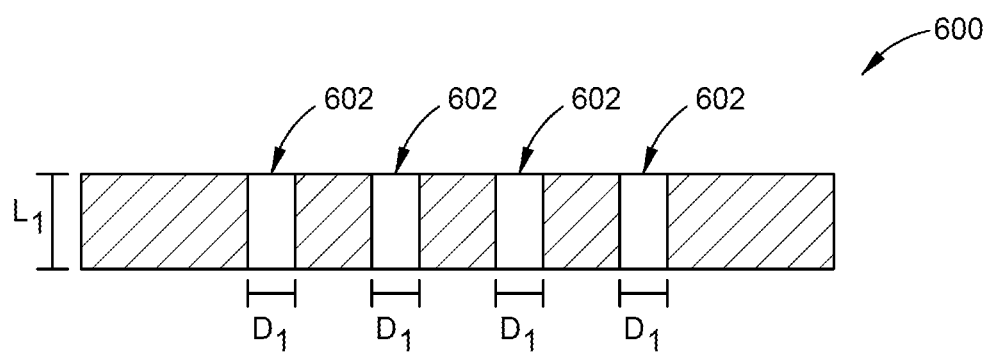
FIG. 6B is a cross-section view (along line 6B) of the separation grid of FIG. 6A according to at least one embodiment of the present disclosure.

Separation grid 116 is configured to separate a processing chamber 110 area from plasma charged particles (ions and electrons), which recombine on the grid, so that only neutral plasma species can pass through the grid into the processing chamber 110. The holes in the bottom section of the separation grid 116 may have different pattern (for example, uniform), as shown in FIGS. 6A and 6B. In some embodiments, separation grid 600 is formed of aluminum, anodized aluminum, quartz, aluminum nitride, aluminum oxide, tantalum, tantalum nitride, titanium, titanium nitride, or combination(s) thereof. For example, AlN can be beneficial for flux of nitrogen radicals, whereas conventional separation grids are more prone to nitrogen radical recombination. Similarly, aluminum oxide can provide flux of oxygen or hydrogen radicals, whereas conventional separation grids are more prone to their recombination. In some embodiments, separation grid 600 has a plurality of holes 602. As shown in FIG. 6B, the plurality of holes 602 are disposed through the separation grid (for example, the holes 602 traverse the thickness of the separation grid). The plurality of holes 602 may have an average diameter that is from about 4 mm to about 6 mm. In some embodiments, each hole of the plurality of holes 602 has a diameter ($D_1$) that is from about 4 mm to about 6 mm. In some embodiments, the separation grid 600 of FIGS. 6A, 6B has a thickness that is from about 5 mm to about 10 mm, which defines the hole length ($L_1$). A ratio of the grid thickness (length ($L_1$)) to the average diameter of the plurality of holes may be greater than about 1, such as about 1 to about 3.

Exhaust 192 is coupled with a sidewall of processing chamber 110. In some embodiments, the exhaust 192 may be coupled with a bottom wall of the processing chamber 110 to provide azimuthal independence (for example, if not rotating pedestal). If lamps are rotating, the exhaust 192 can be coupled with the sidewall, since rotation mitigates azimuthal dependence.

Various features of ICP sources and plasma processing apparatus will now be described with reference to FIGS. 2, 3, 4, and 5. FIGS. 2, 3, 4, and 5 are schematic diagrams of a plasma processing apparatus, according to some embodiments of the present disclosure. Plasma processing apparatus of FIGS. 2, 3, 4, and 5 may be constructed in a similar manner to plasma processing apparatus 100 (FIG. 1) and operate in a manner described above for plasma processing apparatus 100. It will be understood that the components of plasma processing apparatus FIGS. 2, 3, 4, and 5 may also be incorporated into any other suitable plasma processing apparatus in alternative example embodiments.

Figure 2:
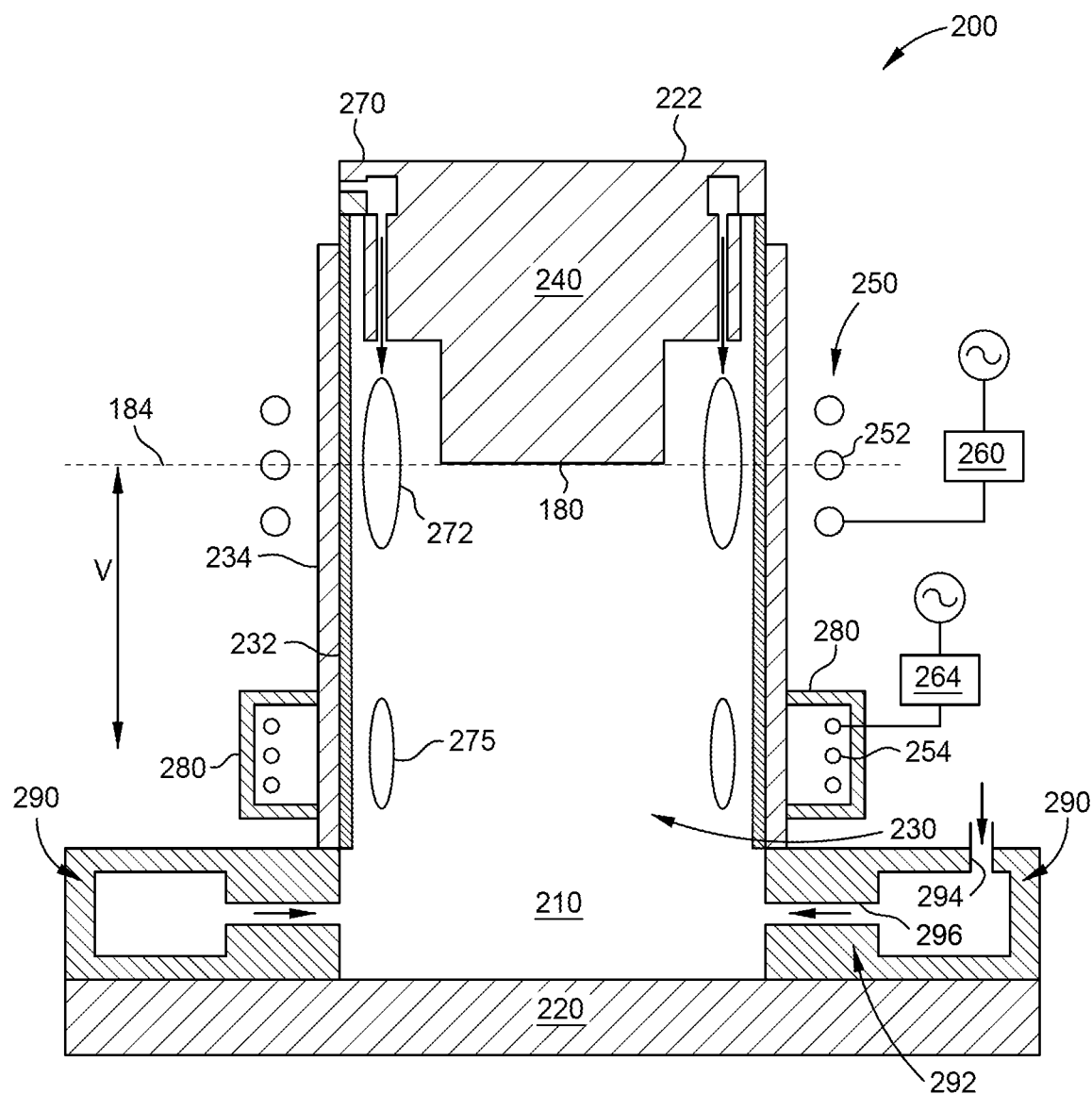
FIG. 2 is a schematic diagram of an example plasma processing apparatus according to at least one embodiment of the present disclosure.

As shown in FIG. 2, plasma processing apparatus 200 includes a processing chamber 220 which has a separation grid (not shown) disposed therein. The plasma processing apparatus 200 includes a plasma source 222 along a vertical direction V. A substrate may be positioned in the processing chamber directly below the grid and some distance from the grid, and neutral particles from a plasma source interior 230 may flow downward through separation grid toward the substrate in the processing chamber 220, and the neutral particles may contact the substrate to perform a process, for example, a surface treatment process.

A plurality of induction coils 250 are disposed at a different position along the vertical direction V on plasma source 222, for example, such that the induction coils (for example, 252 and 254) are spaced from each other along the vertical direction V along plasma source 222. For example, the induction coils 250 may include a first induction coil (peripheral induction coil 252) and a second induction coil (center induction coil 254). The first induction coil (peripheral induction coil 252) may be positioned at a first vertical position along a vertical surface of a dielectric sidewall 232. Second induction coil (center induction coil 254) may be positioned at a second vertical position along a vertical surface of the dielectric sidewall 232. The first vertical position is different from the second vertical position. For instance, the first vertical position may be above the second vertical position. In some embodiments, a portion of the first induction coil (peripheral induction coil 252) is substantially aligned with a surface 180 of the insert as was described above. The second induction coil (center induction coil 254) is disposed at a bottom (for example, lower) portion of the plasma source. The second induction coil includes magnetic field concentrator(s) 280, allowing a placement of the coil in the bottom of the plasma source, as shown in FIG. 2. The use of magnetic field concentrator(s) 280 increases efficiency of the plasma generation at the bottom of the source and significantly increases the radial control near the substrate (as compared to the absence of magnetic field concentrators). In some embodiments, the center induction coil 254 is disposed at a bottom ⅓ height, such as a bottom ¼ height, of the plasma source 222.

The induction coils 250 (252, 254) may be operable to generate (or modify) an inductive plasma within plasma source interior 230. For example, the plasma processing apparatus 200 may include a first radio frequency power generator 262 (for example, RF generator and matching network) coupled with the peripheral induction coil 252. The center induction coil 254 is coupled to a second radio frequency power generator 264 (for example, RF generator and matching network). The frequency and/or power of RF energy applied by the first radio frequency power generator 262 to the first induction coil (peripheral induction coil 252) and the second radio frequency power generator 264 to the second induction coil (center induction coil 254), respectively, can be independent in order to better control process parameters of a surface treatment process.

For example, frequency and/or power of RF energy applied by the second radio frequency power generator 264 can be less than the frequency and/or power of RF energy applied by the first radio frequency power generator 262. The first radio frequency power generator 262 is operable to energize the peripheral induction coil 252 to generate the inductive plasma in the plasma source interior 230. In particular, the first radio frequency power generator 262 may energize peripheral induction coil 252 with an alternating current (AC) of radio frequency (RF) such that the AC induces an alternating magnetic and electric fields inside the volume near peripheral induction coil 252 that heats electrons to generate the inductive plasma. In some embodiments, RF power is provided to the peripheral induction coil 252 at about 1 kW to about 15 kW, such as about 3 kW to about 15 kW. The peripheral induction coil 252 may ignite and sustain a plasma in a wide pressure and flow range. The second radio frequency power generator 264 is operable to energize center induction coil 254 to generate and/or modify plasma in plasma source interior 230. In particular, the second radio frequency power generator 264 may energize the center induction coil 254 with an alternating current (AC) of radio frequency (RF) such that inductive RF electric field inside the volume adjacent to the center induction coil 254 accelerate electrons to generate plasma. In some embodiments, RF power is provided to center induction coil 254 at about 0.5 kW to about 6 kW, such as about 0.5 kW to about 3 kW. The center induction coil 254 may modify the plasma density in the plasma processing apparatus 200. For example, the center induction coil 254 can tune the radial profile of the plasma to promote additional plasma uniformity moving toward a substrate in the processing chamber 220. Since the peripheral induction coil 252 is further away from a substrate during use than the center induction coil 254, the plasma and radicals generated by the peripheral induction coil 252 can promote a dome shaped profile near the substrate, and the center induction coil 254 can flatten (or even raise the edge) the dome-shaped plasma profile as plasma approaches the substrate.

A dielectric sidewall 232 is positioned between induction coils 250 and plasma source 222. The dielectric sidewall 232 has a generally cylindrical shape. An electrically grounded Faraday shield 234 may be made of metal and/or is positioned between the induction coils 250 and the dielectric sidewall 232. The Faraday shield 234 has a cylindrical shape and is disposed about the dielectric sidewall 232. The grounded faraday shield 234 extends the length of the plasma source 222. The dielectric sidewall 232 contains plasma within plasma source interior 230 allowing RF fields from induction coils 250 to pass through to the plasma source interior 230, and the grounded Faraday shield 234 reduces capacitive coupling of the induction coils 250 to the plasma within the plasma source interior 230. In some embodiments, the Faraday shield 234 can be a metal cylinder having slots perpendicular to the coil direction. The vertical slots are in the area of the coil (for example, adjacent the coil), while at least one vertical end of the coil (above or below the coil) has a complete current path around the cylinder. A Faraday shield may have any suitable thickness, and/or the slots may have any suitable shape. Near the coil(s), the slots can be relatively narrow (for example, about 0.5 cm to about 2 cm) and substantially vertical, even when utilizing a helical coil.

As noted above, each induction coil 250 is disposed at a different position along the vertical direction V on the plasma source 222 adjacent a vertical portion of a dielectric sidewall of the plasma source 222. In this way, each induction coil 250 can be operable to generate (or modify) a plasma in a region adjacent to the coil along the vertical surface of the dielectric sidewall 232 of the plasma source 222.

In some embodiments, the plasma processing apparatus 200 includes one or more peripheral gas injection ports 270 disposed through a gas injection insert 240 of the plasma source 222, radially outward of the gas injection insert 240. The peripheral gas injection port 270 and a side shape of the insert are operable to inject process gas at the periphery of the plasma source interior 230, directly into active plasma generation region adjacent the vertical surface of the dielectric sidewall 232. For example, there may be >20 (for example, 70-200) vertical injection holes disposed through gas injection insert 240. For instance, the first induction coil (peripheral induction coil 252) can be operable to generate a plasma in region 272 proximate a vertical surface of the dielectric sidewall 232. The second induction coil (center induction coil 254) can be operable to generate or modify a plasma present in region 275 proximate a vertical surface of the dielectric sidewall 232. The gas injection insert 240, in some embodiments, can further define an active region for generation of the plasma in the plasma source interior 230 adjacent the vertical surface of the dielectric sidewall 232. A top portion of a gas injection insert of the present disclosure can have a diameter that is from about 10 cm to about 15 cm. A bottom portion of a gas injection insert of the present disclosure can have a diameter that is from about 7 cm to about 10 cm.

Plasma processing apparatus 200 can have an edge gas injection port 290 configured to introduce the same or different gas to volume 210 as the peripheral gas injection port 270 provides to plasma source interior 230. Edge gas injection port 290 is coupled with the processing chamber 220 and is a top plate of the processing chamber 220. Edge gas injection port 290 includes a plenum 292 (which may be circular) to which gas is introduced through inlet 294. Gas flows from the plenum 292 through one or more openings 296 to the volume 210. The edge gas injection port 290 can provide fine tuning of the plasma chemistry near the edge of a substrate, and/or improve plasma uniformity at the substrate. For example, the edge gas injection port 290 can provide modification of the flow (same gas), and/or modification of chemistry (chemical reaction between plasma radicals and new feed gas or different gases).

Plasma processing apparatus 200 has improved source tunability relative to known plasma processing apparatus. For example, the induction coils 250 can be positioned in two locations along the vertical surface of the dielectric sidewall 232 such that functions of the peripheral induction coil 252 proximate to the active plasma generation region are plasma ignition and sustaining in the plasma source interior 230, and functions of the center induction coil 254 placed at the bottom of the source allow the advantageous source tunability. The low positioning of the second coil is possible due to the use of magnetic field concentrator(s) 280, which provides coupling of the coil to plasma rather than to surrounding metal (for example, 290). In such a manner, a treatment process performed with the plasma processing apparatus 200 on a substrate may be more uniform.

Figure 3:
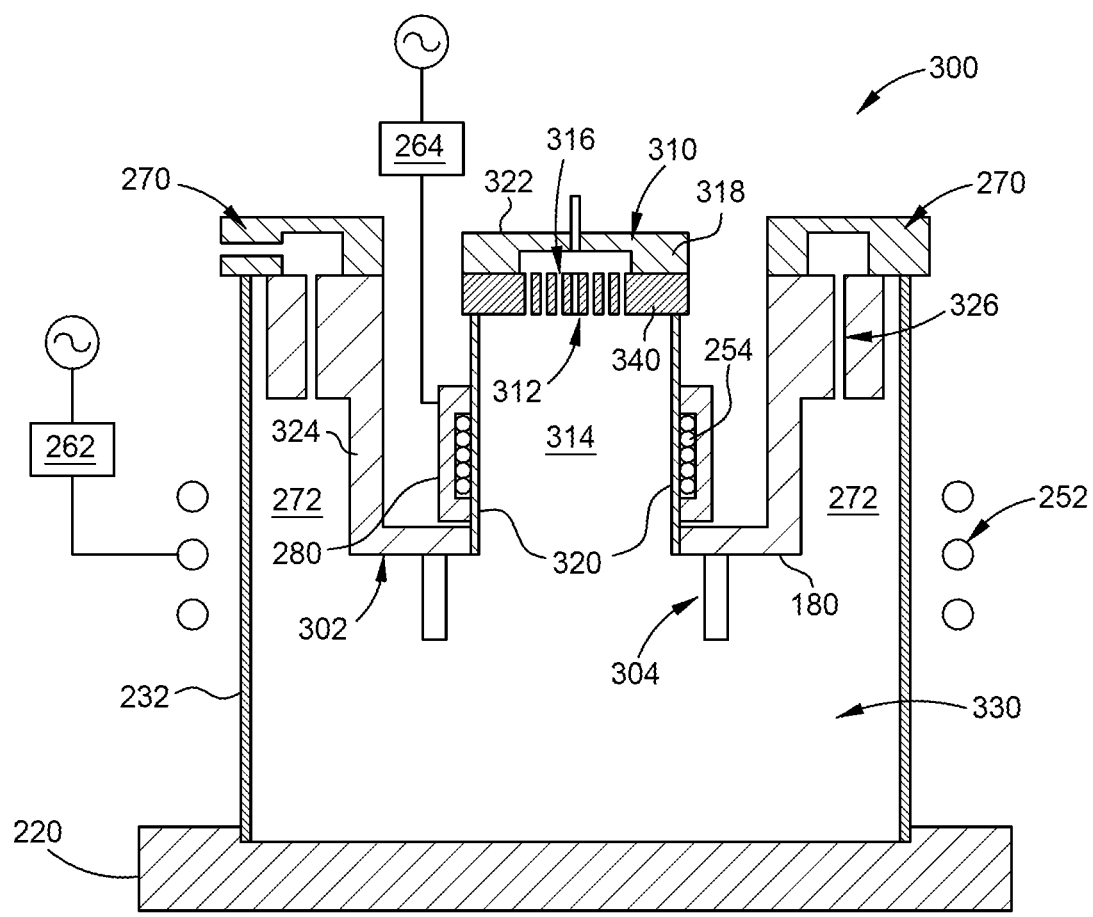
FIG. 3 is a schematic diagram of an example plasma processing apparatus according to at least one embodiment of the present disclosure.

FIG. 3 is a schematic diagram of a plasma processing apparatus 300. The plasma processing apparatus 300 includes a plasma source 322 and a processing chamber 220. The plasma source 322 includes gas injection insert 302 having a peripheral gas injection port 270 and a center gas injection port 310. The center gas injection port 310 is formed by a top plate 318 and a bottom plate 340 forming a plenum 316. The bottom plate 340 has a plurality of holes (throughholes) 312 to enable the center gas injection port 310/gas injection insert 302 to have a plurality of the holes (throughholes) 312 for providing process gas into center process region 314. The dimensions of center process region 314 are provided by portions of gas injection insert 302, namely center gas injection port 310 and sidewall 320. The sidewall 320 has a cylindrical shape and is a dielectric material. For example, the sidewall 320 is formed from quartz or alumina. The dimensions of region 272 are provided by dielectric sidewall 232 and gas injection insert 302, namely peripheral gas injection port 270 and sidewall 324. The sidewall 324 (and gas injection insert 302 in general) can have a cylindrical shape. The sidewall 324 surface material can be a dielectric material or a metal. For example, the sidewall 324 is formed from aluminum and may be covered with quartz, or alumina, or have bare or anodized aluminum surface. In addition, a first Faraday shield (not shown) can be disposed between the peripheral induction coil 252 and the dielectric sidewall 232. Likewise, a second Faraday shield (not shown) can be disposed between the center induction coil 254 and the sidewall 320. In some embodiments, sidewall 320 is quartz or ceramic and/or has a thickness that is from about 2.5 mm to about 5 mm.

A flow rate of process gas provided by the peripheral gas injection port 270 via a conduit 326 to the region 272 can be greater than a flow rate of process gas provided by center gas injection port 310 to the center process region 314. In some embodiments, a ratio of flow rate of process gas provided by the peripheral gas injection port 270 to a flow rate of process gas provided by center gas injection port 310 is about 2:1 to about 20:1, such as about 5:1 to about 10:1. Providing a higher flow rate to the region 272 than a flow rate to the center process region 314 provides improved center-edge uniformity of a plasma at a substrate surface of a substrate present in the processing chamber 220.

The plasma processing apparatus 300 further includes the peripheral induction coil 252 and the center induction coil 254. An RF power provided by peripheral induction coil 252 can be greater than an RF power provided by the center induction coil 254. In some embodiments, a ratio of RF power provided by peripheral induction coil 252 to RF power provided by the center induction coil 254 is about 2:1 to about 20:1, such as about 3:1 to about 10:1, such as about 5:1. If the center coil is not energized, the secondary plasma source serves as auxiliary gas injection that reduces fluxes of radicals and ions/electrons created by the peripheral induction coil 252 toward the center of the substrate. Because plasma density is typically higher at a center of a substrate during conventional plasma processes, providing a greater RF power to the center induction coil 254 than RF power provided to the peripheral induction coil 252 promotes increased plasma density at an edge portion(s) of the substrate, improving plasma uniformity. Plasma separator(s) 304 (cylindrical protrusions) between central and edge areas improve the capability of independent central-edge plasma control.

The peripheral induction coil 252 and the center induction coil 254 may be operable to generate (or modify) an inductive plasma within plasma source interior 330. For example, the plasma processing apparatus 300 may include a first radio frequency power generator 262 (for example, RF generator and matching network) coupled with the peripheral induction coil 252. The center induction coil 254 is coupled to a second radio frequency power generator 264 (for example, RF generator and matching network). The frequency and/or power of RF energy applied by the first radio frequency power generator 262 to the peripheral induction coil 252 and the second radio frequency power generator 264 to the center induction coil 254, respectively, can be adjusted to be the same or different to control process parameters of a substrate treatment process.

For example, frequency and/or power of RF energy applied by the second radio frequency power generator 264 can be less than the frequency and/or power of RF energy applied by the first radio frequency power generator 262. The first radio frequency power generator 262 is operable to energize peripheral induction coil 252 to generate the inductive plasma in plasma source interior 330. In particular, the first radio frequency power generator 262 may energize the peripheral induction coil 252 with an alternating current (AC) of radio frequency (RF) such that the AC induces an alternating magnetic field inside the peripheral induction coil 252 that heats a gas to generate the inductive plasma. In some embodiments, RF power is provided to the peripheral induction coil 252 at about 1 kW to about 15 kW, such as about 3 kW to about 10 kW.

The second radio frequency power generator 264 is operable to energize the center induction coil 254 to generate and/or modify an inductive plasma in the center process region 314 of the plasma source 322. In particular, the second radio frequency power generator 264 may energize the center induction coil 254 with an alternating current (AC) of radio frequency (RF) such that the AC induces an alternating magnetic field inside the center induction coil 254 that heats a gas to generate and/or modify the inductive plasma. In some embodiments, RF power is provided to the center induction coil 254 at about 0.3 kW to about 3 kW, such as about 0.5 kW to about 2 kW. The center induction coil 254 may modify the plasma in the plasma processing apparatus 300, for example, the center induction coil 254 can tune the radial profile of the plasma to promote additional plasma uniformity moving toward a substrate in the processing chamber 220.

In some embodiments, the plasma processing apparatus 300 includes a peripheral gas injection port 270 operable to inject process gas at the periphery of the region 272 along a vertical surface of the dielectric sidewall 232, defining active plasma generation region(s) adjacent the vertical surface of the dielectric sidewall 232. For instance, the peripheral induction coil 252 can be operable to generate a plasma in the region 272 proximate a vertical surface of the dielectric sidewall 232. The center induction coil 254 can be operable to generate and/or modify a plasma present in a center process region 314 proximate a vertical surface of the sidewall 320. The gas injection insert 302, in some embodiments, can further define an active region for generation of the plasma in the plasma source interior adjacent the vertical surface of the dielectric sidewall 232 and the vertical surface of the sidewall 320.

In practice, the substrate can be provided some overlap of the process plasma formed in the center process region 314 with the process plasma formed in the region 272. Overall, peripheral gas injection port 270/center gas injection port 310 and peripheral induction coil 252/center induction coil 254 can provide improved plasma and process uniformity (center-to-edge plasma control) for treating a substrate with a plasma. To enhance center-to-edge process control, the gas injection insert 302 includes a plasma separator(s) 304. The plasma separator(s) 304 may be a uniform cylindrical separator coupled with (for example, disposed along) surface 180.

In addition, in embodiments where the process gas provided by center gas injection port 310 is different than process gas provided by the peripheral gas injection port 270, new plasma chemistries may be obtained as compared to conventional plasma processes using a conventional plasma source. For example, advantageous processing of substrates may be provided, which cannot be obtained in conventional plasma processing. For example, a unique mix of plasma can be created if one mixes a plasma generated flow of radicals and excited species (for example, some embodiments of region 272) with a flow of different plasma rich on different kind of plasma species, for example, different radicals. In addition, formation of these unique plasma chemistries can be obtained in embodiments utilizing alignment of the surface 180 with a portion of the peripheral induction coil 252, for example, as described above.

Figure 4:
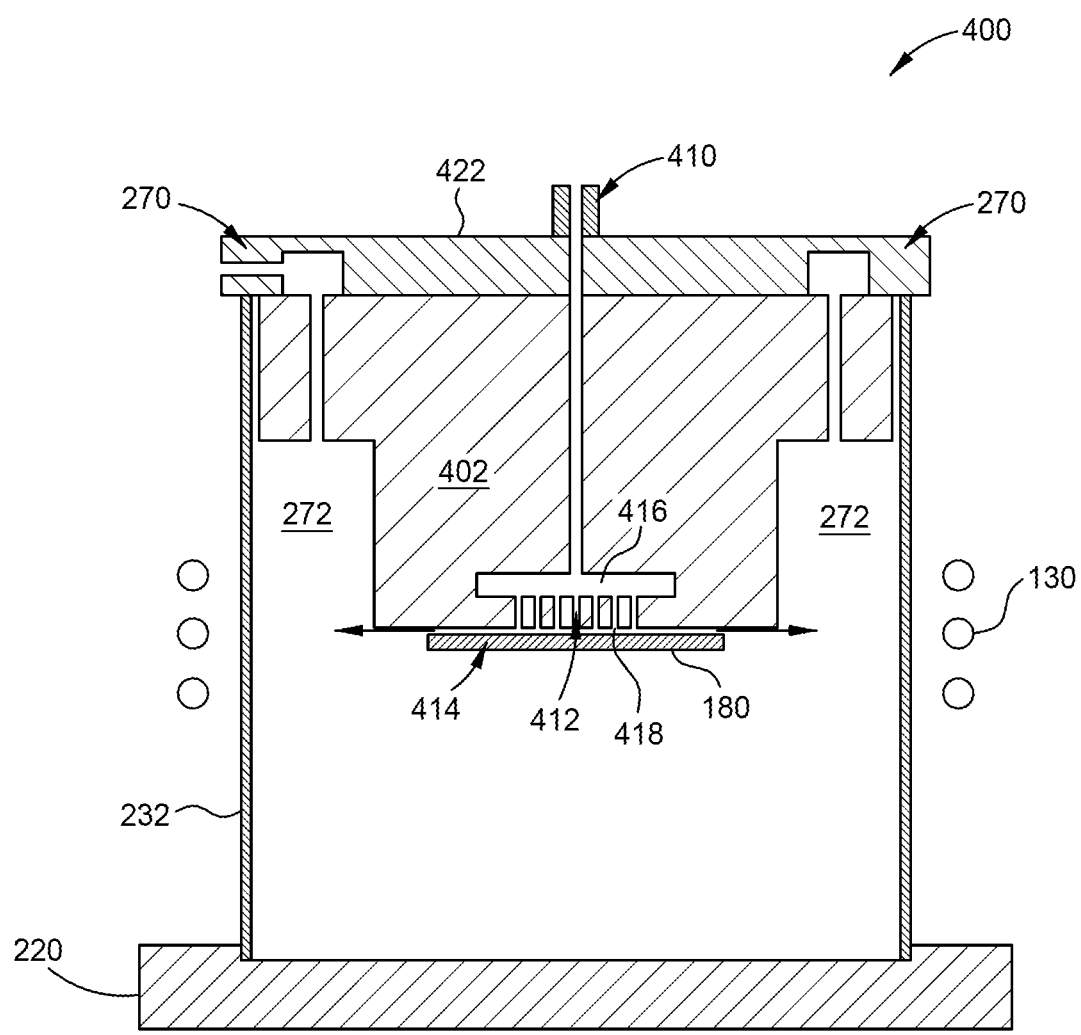
FIG. 4 is a schematic diagram of an example plasma processing apparatus according to at least one embodiment of the present disclosure.

FIG. 4 is a schematic diagram of a plasma processing apparatus 400. The plasma processing apparatus 400 includes a plasma source 422. The plasma source 422 includes a gas injection insert 402, which can be integrated with the top cover, a peripheral gas injection port 270, and a center gas injection port 410. The center gas injection port 410 is disposed within the gas injection insert 402 to fluidly couple the center gas injection port 410 with a gas distribution plenum 416 of gas injection insert 402. The gas distribution plenum 416 provides an increased diameter (as compared to a diameter of the center gas injection port 410) for a process gas to distribute uniformly before the process gas enters the exhaust region between the bottom of the gas injection insert 402 and the platform 414. Once the gas is provided through holes 412, the platform 414 provides a second gas distribution plenum and promotes an outward flow of the gas to a periphery (for example, into regions 272) of the plasma source 422. In some embodiments of the present disclosure, the material to form the holes 412 is absent and a larger plenum is formed. The platform 414 can be coupled with the gas injection insert 402 via a plurality of screws or bolts (not shown). The platform 414 can be made of quartz or ceramic. The platform 414 can have any suitable design, which allows different materials. The outward/sideways flow of gas promoted by the platform 414 can affect the flow profile of gas/plasma to a substrate during processing, improving center-to-edge uniformity, as compared to conventional plasma process apparatus. In addition, this outward flow of the gas to a region adjacent to a plasma generation region (for example, region 272) of the plasma source 422 provides benefits. Because high plasma density can be created in region 272 adjacent to the top part of the induction coil 130, the electric field does not penetrate far away from the coil, so the gas from the center injection 410-416-414 does not experience a lot of ionization or dissociations, but the gas interacts chemically with high density radicals and ions created in the region 272. Both radicals and ions are active chemically and interact with a new feed gas from the center injection 410-416-414. The new feed gas, radicals, and ions may create new plasma chemistries as compared to conventional plasma sources using a plasma processing chamber. For example, a unique mix of plasma can be created if one mixes a plasma generated flow of radicals and excited species (for example, some embodiments of region 272) with a new flow of gas that does not pass through the region 272 with hot electrons (for example, the process gas provided by center gas injection port 410 and platform 414/region 418). For example, one can mix flow of $H^+$ and H-radicals obtained in plasma from the $H_2$ feed gas (for example, from gas provided by the peripheral gas injection port 270) with a flow of oxygen $O_2$ (for example, from gas provided by center gas injection port 410), where one can significantly increase fraction of $HO_2$, HO, $H_2O_2$, and other non-equilibrium molecules, etc. in the region adjacent to region 272 related to the induction coil 130. In addition, formation of these unique plasma chemistries can be obtained in embodiments utilizing alignment of surface 180 edge with a portion of the induction coil 130, for example, as described above.

In some embodiments, a ratio of flow rate of process gas provided by the peripheral gas injection port 270 to a flow rate of process gas provided by the center gas injection port 410 is about 20:1 to about 1:20, such as about 10:1 to about 1:10, such as about 2:1 to about 1:2, such as about 1.2:1 to about 1:1.2, such as about 1:1. Such flow rates may provide a stoichiometry (for example, substantially equimolar amounts) of the different process gases to provide desired densities of chemical species in a plasma formed in regions 272.

In addition, the outward/sideways flow provided by center gas injection port 410 and platform 414/region 418 can modify flow patterns within the plasma source 422 affecting delivery profile of radicals to the substrate. For example, in embodiments where the process gas provided by the center gas injection port 410 is substantially the same as the process gas provided by the peripheral gas injection port 270, more plasma flow is promoted toward an edge of a substrate, improving the center-edge plasma profile (for example, uniformity of plasma provided to the substrate).

In addition, in embodiments where the process gas provided by the center gas injection port 410 is different than process gas provided by the peripheral gas injection port 270, new plasma chemistries may be obtained as compared to conventional plasma processes using a conventional plasma source. For example, advantageous processing of substrates may be provided, which cannot be obtained in conventional plasma processing. For example, a unique mix of plasma can be created if one mixes a plasma generated flow of radicals and excited species (for example, some embodiments of region 272) with a new flow of gas that does not pass through the plasma region with hot electrons. For example, one can mix flow of N-radical obtained in plasma from the $N_2$ feed gas with a flow of Nitrogen ($N_2$), hydrazine, and/or $NH_3$, where one can generate a large number of different radicals like NH, $NH_2$ molecules, etc. in a region of plasma processing apparatus 400 that is downstream of regions 272. In addition, formation of these unique plasma chemistries can be obtained in embodiments utilizing alignment of surface 180 with a portion of the peripheral induction coil 252, for example, as described above.

Figure 5:
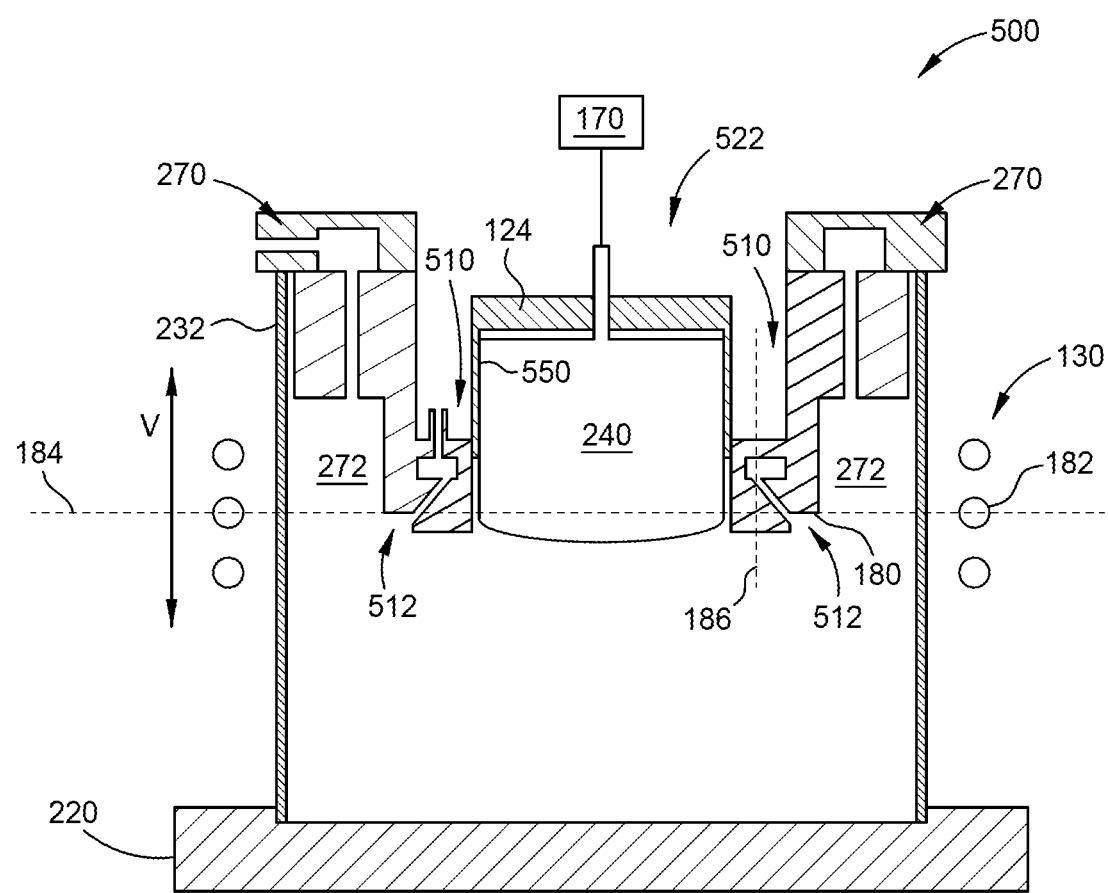
FIG. 5 is a schematic diagram of an example plasma processing apparatus according to at least one embodiment of the present disclosure.

FIG. 5 is a schematic diagram of a plasma processing apparatus 500. Plasma processing apparatus 500 includes plasma source 522 and processing chamber 220. The plasma source 522 includes a gas injection insert 240, a peripheral gas injection port 270, a center gas injection port 510, and top plate 124. The center gas injection port 510 can be disposed proximate (for example, adjacent) a wall 550. Center gas injection includes a center gas injection port 510 having a generally cylindrical plenum/manifold and a plurality of angled outlets 512 uniformly spread along the plenum. The gas injection insert 240 can likewise have a generally cylindrical shape. The center gas injection port 510 has angled outlet 512 to promote outward/sideways flow of process gas provided by the center gas injection port 510 and angled outlets 512. The angled outlets 512 can have an angle that is from about 0 degree to about 90 degrees, such as about 30 degrees to about 60 degrees, such as about 45 degrees, relative to a vertical axis (such as vertical axis 186, which is parallel to an axial centerline of the plasma processing apparatus 500 and/or the axial centerline of the plasma source 522).

The outward/sideways flow of gas promoted by angled outlet 512 can affect the flow profile of gas/plasma to a substrate during processing, improving center-to-edge uniformity, as compared to conventional plasma process apparatus. In addition, because a high plasma density can be created in a region adjacent the induction coil 130 (and the electric field does not penetrate far away from the coil), new plasma chemistries can be obtained as compared to conventional plasma processes using a plasma processing chamber. For example, a unique mix of plasma can be created if one mixes a plasma generated flow of radicals and excited species (for example, some embodiments of region 272) with a new flow of gas that does not pass through the plasma region with hot electrons (for example, the process gas provided by the center gas injection port 510 and angled outlet 512). For example, one can mix flow of N-radicals obtained in plasma from the $N_2$ feed gas (for example, from gas provided by peripheral gas injection port 270) with a flow of $N_2$, hydrazine, and/or $NH_3$ (for example, from gas provided by center gas injection port 510), where one can generate molecular radicals like NH, $NH_2$ molecules, etc. in region 272 adjacent the induction coil 130. In addition, formation of these unique plasma chemistries can be obtained in embodiments utilizing alignment of induction coil 130 with surface 180, as described above.

In some embodiments, a ratio of flow rate of process gas provided by the peripheral gas injection port 270 to a flow rate of process gas provided by center gas injection port 510 is about 2:1 to about 1:2, such as about 1.2:1 to about 1:1.2, such as about 1:1. Such flow rates may provide a stoichiometry (for example, substantially equimolar amounts) of the different process gases to provide desired densities of chemical species in a plasma formed in regions 272.

In addition, the outward/sideways flow provided by center gas injection port 510 and angled outlets 512 can modify flow patterns within the plasma source 522 affecting delivery profile of radicals to the substrate. For example, in embodiments where the process gas provided by center gas injection port 510 is substantially the same as the process gas provided by peripheral gas injection port 270, more plasma flow is promoted toward an edge of a substrate, improving the center-edge plasma profile (for example, uniformity of plasma provided to the substrate).

Furthermore, gas injection insert 240 of FIG. 5 has a fixed edge at the surface 180, defining the active region that marks the axis 184 (or alignment level) for the induction coil 130. The induction coil 130 is substantially aligned with surface 180 in such a way that the top turn of the coil is positioned above the axis 184 (surface 180), and the bottom turn is positioned below the edge. One may further adjust position of the coil within this range based on the process results. Alignment of coil vertical center with surface 180 provides improved source efficiency, namely controlled generation of desired chemical species for plasma processes and delivering them to the substrate with minimum losses. For example, plasma sustaining conditions (balance between local generation and loss of ions) might not work well for generating species for a plasma process. Regarding delivery of the species to the substrate, efficiency can depend on the volume and wall recombination of these particular species. Hence, control of the alignment of the induction coil 130 with the surface 180 (edge) provides control of the source efficiency for a plasma process.

In some embodiments, a bottom surface of gas injection insert 240 is aligned with the surface 180 of the insert defining the active region for the coil (this alignment level is shown as axis 184) by utilizing a suitably sized gas injection insert 240 to form the plasma source 120. Alternatively, the bottom surface of the gas injection insert 240 can be made flexible using a movable central part as shown in FIG. 5 of the gas injection insert 240, while a remainder portion of gas injection insert 240 is fixed as part of plasma source 120. For example, a mechanism 170 can be electronically coupled with the central part of gas injection insert 240 to adjust the central part such that the central part of gas injection insert 240 having a first position is adjusted to a second position. In some embodiments, a difference in position from the first position to the second position is about 0.1 cm to about 10 cm, such as about 1 cm to about 2 cm. Mechanism 170 can be any suitable mechanism, such as an actuator, for example a motor, electric motor, stepper motor, or pneumatic actuator. Movement of the central part of the gas injection insert 240 by mechanism 170 increases or decreases a space between the central part and top plate 124.

In general, moving the central part of the gas injection insert 240 downward along a vertical direction V will reduce the flow of active species toward the center of the substrate and thus decrease the process rate in the center vs. edge, while moving the central part upward will increase the process rate in the center vs. edge.

Although the FIGS. have been described independently, it is to be understood that one or more embodiments from one Figure may be beneficially incorporated with one or more embodiments of a different Figure. For example, gas injection insert 140 of FIG. 1 or gas injection insert 240 of FIG. 2 may be gas injection insert 302 of FIG. 3, gas injection insert 402 of FIG. 4, or the configuration of gas injection insert 240 and center gas injection port 510 of FIG. 5. As another non-limiting example, the edge gas injection port 290 may be included as an embodiment with the plasma processing apparatus 300 of FIG. 3, the plasma processing apparatus 400 of FIG. 4, and the plasma processing apparatus 500 of FIG. 5.

Figure 7:
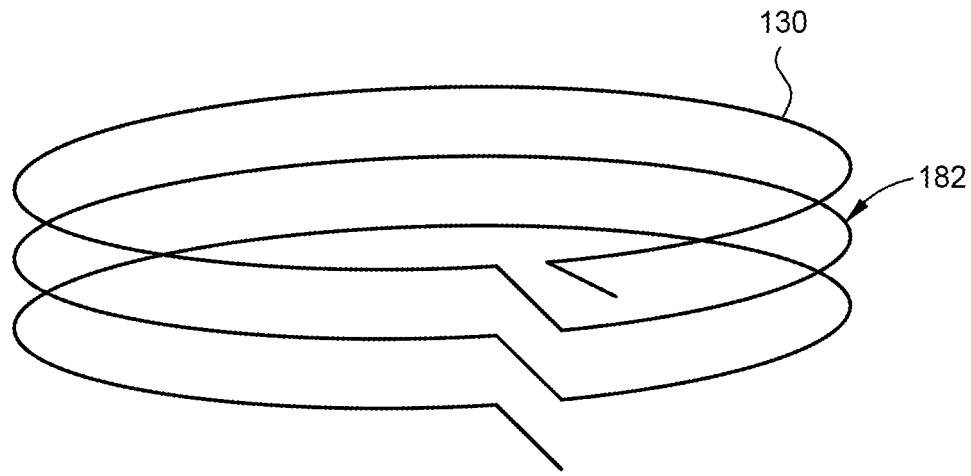
FIG. 7 is an example induction coil that can be used with an example plasma source according to at least one embodiment of the present disclosure.

FIG. 7 is an induction coil 130 that can be used with a plasma source. Induction coil 130 includes a plurality of coil loops including coil loop 182. The induction coil 130 includes 3 complete coils, but more or less coils are contemplated. For example, an induction coil may have 2-6 complete turns for RF frequency of 13.56 MHz. More turns may be utilized for lower RF frequency.

Example Methods

The present disclosure is also related to plasma processing of a substrate with a plasma processing apparatus of the present disclosure. In some embodiments, the plasma processing is a nitridation method that, for example, increases the amount of nitrogen in the substrate being processed. The nitridation method is a radical species nitridation using plasma processing. Embodiments of the methods described herein can enable, for example, higher nitrogen dosing and nitride thickness of a substrate being processed with lower thermal budgets relative to conventional nitridation methods. Moreover, methods described herein can be highly conformal in high-aspect ratio structures. Further, method described herein can be cyclic, combined with a hydrogen radical treatment, and/or combined with an oxygen radical treatment to achieve desired results. The nitridation methods described herein can be performed in a single chamber with other processes, such as other radical treatment processes. Embodiments of the nitridation methods described herein can be selective depending on, for example, the substrate and the nitrogen-containing source.

Figure 8:
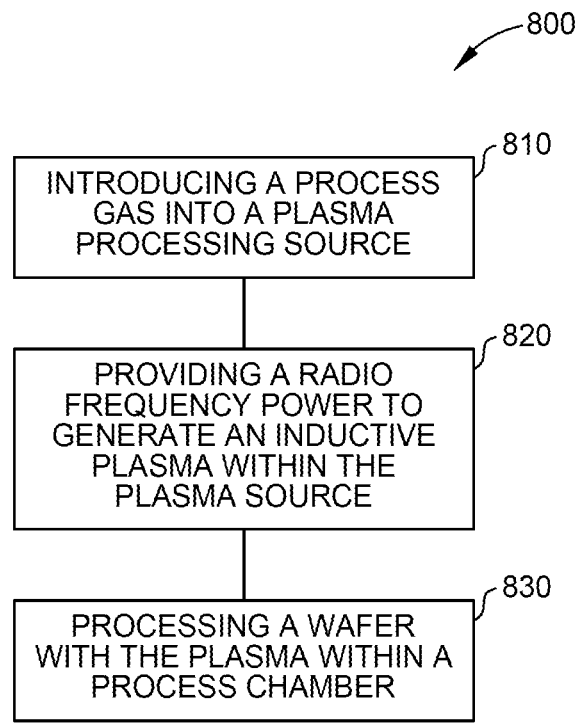
FIG. 8 is a flowchart showing operations of an example method for nitridation of a substrate according to at least one embodiment of the present disclosure.

FIG. 8 is a flowchart showing example operations of a method 800 for plasma processing a substrate with a plasma processing apparatus of the present disclosure. Embodiments of the plasma processing apparatus shown in FIGS. 1-7 can be utilized with the method 800, though the method is not limited to such embodiments.

Method 800 includes introducing a process gas into a plasma processing source at operation 810. The process gas and flow rate thereof are selected based on a particular substrate processing application. In general, the process gas can include at least one of $N_2$, $NH_3$, hydrazine ($N_2H_4$), $O_2$, $H_2$, a noble gas (He, Ar, Ne, Kr, Xe), or combinations thereof. The noble gas can serve as a carrier gas. A flow rate of the process gas and/or carrier gas can be from about 50 sccm to about 20,000 sccm as further described below. Other process gases and/or carrier gases, as well as flow rates thereof, are contemplated.

Illustrative, but non-limiting, examples of substrates that can be utilized with methods described herein include silicon-containing substrates such as crystalline-Si (c-Si), amorphous-Si (a-Si), and polycrystalline-Si (poly-Si); silicon- and germanium-containing substrates including SiGe, amorphous-SiGe (a-SiGe), and polycrystalline-SiGe (poly-SiGe); silicon oxides ($SiO_x$) such as $SiO_2$; silicon nitrides ($SiN_x$) such as $Si_3N_4$; hafnium oxides ($HfO_x$) such as $HfO_2$; hafnium zirconium oxides ($Hf_xZr_yO_z$); and combinations thereof. Other substrates are contemplated.

The substrates can be logic CMOS structures such as planar FETs, FinFETs, and gate all around structures, dynamic random-access memory (DRAM) structures, 3D NAND structures, and high-aspect ratio structures having an aspect ratio of greater than about 20:1, such as from about 20:1 to about 200:1, such as from about 100:1 to about 200:1.

The method 800 further includes providing a radio frequency power to generate an inductively-coupled plasma within the plasma source at operation 820. The radio frequency power may be controlled based on the particular substrate processing application. In general, the radio frequency power may be about 1 kW to about 10 kW, however other power levels are also contemplated. From an interior region of the plasma source, neutral particles and/or radicals of the inductive plasma flow through a separation grid to the substrate within a processing chamber. Although a separation grid is shown in FIG. 1, the method 800 may be carried out without a separation grid.

The method 800 further includes processing the substrate within the processing chamber at operation 830. The temperature and pressure of the processing chamber can be controlled based on the particular substrate processing application. In general, and in some embodiments, the processing chamber can be operated at a temperature that is from about 100° C. to about 1200° C., such as from about 150° C. to about 650° C.; and/or a pressure that is from about 0.025 Torr (25 millitorr (mTorr)) to about 5 Torr, such as from about 0.050 Torr (50 mTorr) to about 2 Torr. However, other temperatures and pressures are contemplated.

A heat source used to control the temperature of the processing chamber can include a lamp 176 (or plurality of lamps) positioned above the substrate, a lamp (or plurality of lamps) positioned below the substrate, a heater embedded within the substrate support, or combinations thereof. When heating is performed using a lamp source positioned above the substrate, the plasma injection would occur from the side of the processing chamber. Other heat sources are contemplated. These heat sources, or other heat sources, can be operated at temperatures described herein. In some examples, the substrate is heated using either a ceramic resistive heater and/or using an array of lamps.

The substrate in the processing chamber may be exposed to neutral particles and/or radicals generated in the inductive plasma that pass through the separation grid. The plasma, including neutral particles and/or radicals contained therein, can contact a first side of the substrate facing the plasma source. In some embodiments, the substrate is heated using a heat source (for example, a plurality of lamps) disposed opposite the first side of the substrate. The neutral particles and/or radicals can be used, for instance, as part of a surface treatment process of the substrate. In practice, gas flow rates and/or gas ratios may be selected so that the surface of the substrate is saturated with the reactant supply of neutral particles and/or radicals. The capability of the apparatus disclosed herein to provide for surface saturation of the reactive species can be attributed to a very high density source and a shortened distance between the plasma source and the substrate.

In plasma processing operations without surface saturation, the arrival rate of the reactive species to the substrate surface determines the rate of reaction and/or incorporation of the reactive species. However, using apparatus and/or methods disclosed herein, reactive species are saturated on the surface due to high species flux such that diffusion of the reactive species becomes the dominating factor. Since temperature determines the diffusion of the reactive species and drives the reaction, the reaction is temperature-dependent. Because thermal energy is conformal in nature, being substantially uniform in three-dimensions, methods disclosed herein, which are controlled based on temperature, produce a more conformal surface treatment compared to plasma processing operations in which the arrival rate of the reactive species is rate determining.

In general, processing times for the operation 830 may be about 10 seconds to about 10 minutes depending on the particular substrate processing application, however other processing times are also contemplated. It will be appreciated that the method 800 can be performed using any of the plasma processing apparatus of the present disclosure.

The plasma can be generated by energizing one or more induction coils proximate the plasma source with RF energy to generate a plasma using a process gas introduced into the plasma source. For instance, process gas can be admitted into the plasma source from a gas source. RF energy from RF source(s) can be applied to induction coil(s) to generate a plasma in the plasma source.

In general, the method 800 can be used for an array of different substrate processing applications including without limitation, nitrogen radical treatment (for example, nitridation), oxygen radical treatment (for example, oxidation), hydrogen radical treatment, helium radical treatment, and various pre- and post-treatments.

Figure 9:
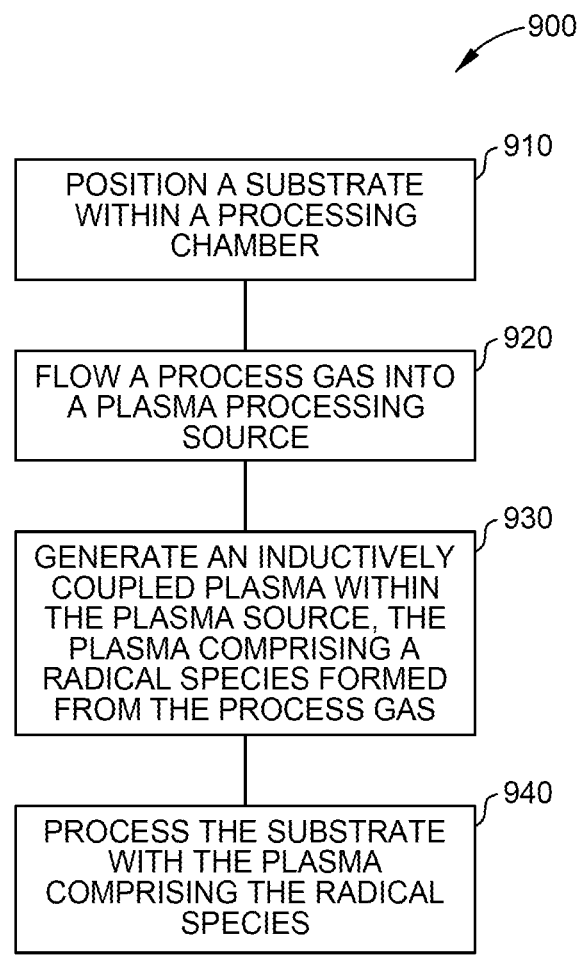
FIG. 9 is a flowchart showing operations of an example method for nitridation of a substrate according to at least one embodiment of the present disclosure.

FIG. 9 is a flow diagram of a method 900 for plasma processing a substrate with a plasma processing apparatus of the present disclosure. Embodiments and implementations of method 800 can be utilized with method 900. Embodiments of the plasma processing apparatus shown in FIGS. 1-7 can be utilized with the method 900, though the method is not limited to such embodiments.

Method 900 begins with positioning a substrate within a processing chamber at operation 910. For example, substrate 114 can be positioned on substrate support 112 in the processing region/volume of the processing chamber 110. As described herein, the processing chamber can have a plasma processing source that is integrated within and/or positioned above the processing chamber (or positioned above the processing region/volume of the processing chamber). The plasma processing source includes an inductively-coupled plasma source that can be operated at desired power levels, further described below.

Illustrative, but non-limiting, examples of substrates that can be utilized with method 900 described herein include silicon-containing substrates such as crystalline-Si (c-Si), amorphous-Si (a-Si), and polycrystalline-Si (poly-Si); silicon- and germanium-containing substrates including SiGe, crystalline-SiGe, amorphous-SiGe (a-SiGe), and polycrystalline-SiGe (poly-SiGe); silicon oxides ($SiO_x$) such as $SiO_2$; silicon nitrides ($SiN_x$) such as $Si_3N_4$; hafnium oxides ($HfO_x$) such as $HfO_2$; hafnium zirconium oxides ($Hf_xZr_yO_z$); and combinations thereof. Other substrates are contemplated.

The substrates can be logic CMOS structures such as planar FETs, FinFETs, and gate all around structures, DRAM structures, 3D NAND structures, and high-aspect ratio structures having an aspect ratio of greater than about 20:1, such as from about 20:1 to about 200:1, such as from about 100:1 to about 200:1.

The method 900 further includes flowing a process gas into the plasma processing source at operation 920. For example, the process gas can be flowed into a gas injection channel defined between a gas injection insert and a sidewall of a plasma source. The process gas can include a nitrogen-containing source (or plurality thereof) and a carrier gas (or plurality thereof). Illustrative, but non-limiting, examples of nitrogen-containing sources include $NH_3$, $N_2$, hydrazine ($N_2H_4$), and combinations thereof. Illustrative, but non-limiting, examples of carrier gases include noble gases such as Ar, He, Ne, Kr, Xe, and combinations thereof.

A flow rate of the nitrogen-containing source into the plasma processing source can be about 50 sccm to about 5,000 sccm, such as from about 100 sccm to about 700 sccm, such as from about 150 sccm to about 650 sccm, such as from about 200 sccm to about 600 sccm, such as from about 250 sccm to about 550 sccm, such as from about 300 sccm to about 500 sccm, such as from about 350 sccm to about 450 sccm. Higher or lower flow rates of the nitrogen-containing source are contemplated.

A flow rate of the carrier gas into the plasma processing source can be about 1000 sccm to about 20000 sccm, such as from about 1500 sccm to about 4500 sccm, such as from about 2000 sccm to about 4000 sccm, such as from about 2500 sccm to about 3500 sccm, such as from about 2500 sccm to about 3000 sccm, or from about 3000 sccm to about 3500 sccm. Higher or lower flow rates of the carrier gas are contemplated.

In some embodiments a flow rate of the nitrogen-containing source can be set relative to a flow rate of the carrier gas. For example, a flow rate of the nitrogen-containing source can be about 1% to about 25% of the flow rate of the carrier gas, such as from about 2% to about 22%, such as from about 3% to about 20%, such as from about 5% to about 15%, such as from about 8% to about 12%, from about 5% to about 10%, or from about 10% to about 15% of the flow rate of the carrier gas. In some embodiments, the flow rate of the nitrogen containing source can be from about 3% to about 100% of the flow rate of the carrier gas, such as from about 3% to about 20%, such as from about 5% to about 15%. Higher or lower ratios are contemplated. As a non-limiting example, when the flow rate of the nitrogen-containing source is about 300 sccm and the flow rate of the carrier gas is about 3000 sccm, the flow rate of the nitrogen-containing source is about 10% of the flow rate of the carrier gas. Higher or lower relative flow rates are contemplated.

The method 900 can further include generating an inductive plasma (or inductively-coupled plasma) within the plasma source at operation 930. The inductively-coupled plasma includes radical species formed from the process gas, for example, radical species formed from one or more nitrogen-containing sources and/or radical species formed from one or more carrier gases. Such radical species can include N and/or NH, for example, N* and/or NH*. The radio frequency power of the ICP source can be operated at a power that is from about 1,000 W to about 12,000 W, such as from about 2,000 W to about 10,000 W, such as from about 3,000 W to about 9,000 W, such as from about 4,000 W to about 8,000 W, such as from about 5,000 W to about 7,000 W, though a higher or lower power is contemplated. Here, the radio frequency power generates an inductive plasma (or inductively-coupled plasma) adjacent the plasma source. Radicals and/or neutral particles of the inductive plasma can flow through a separation grid to the substrate 114 within the processing chamber. Although a separation grid is shown in FIG. 1, the method 900 may be carried out without a separation grid.

In some embodiments, which can be combined with other embodiments, the heat source includes a lamp having a plasma source output that can be adjusted depending on the desired application. The plasma source output can be from about 2" (~2 inches) in diameter to about 15 inches in diameter, such as from about 2 inches in diameter to about 14 inches in diameter, such as from about 4 inches in diameter to about 12 inches in diameter, such as from about 6 inches in diameter to about 10 inches in diameter. In at least one embodiment, the heat source includes a lamp having a plasma source output that is from about 2 inches in diameter to about 12 inches in diameter or from about 4 inches to about 12 inches in diameter. These diameters are the diameter of the outlet of the plasma cavity from which the radical species exits from the plasma cavity and travels out towards the substrate.

The method 900 can further include processing the substrate (or a layer of the substrate) with the plasma comprising the one or more radical species at operation 940. Processing the substrate can include nitriding the substrate (or a layer of the substrate). Operation 940 can include operating the processing chamber at selected temperature and pressure. A heat source can be operated at a temperature that is from about 100° C. to about 1200° C., such as from about 150° C. to about 650° C., such as from about 200° C. to about 600° C., such as from about 250° C. to about 550° C., such as from about 300° C. to about 500° C., such as from about 350° C. to about 450° C., such as from about 350° C. to about 400° C. or from about 400° C. to about 450° C. Here, and in some examples, the heat source used to control the temperature of the processing chamber can include a lamp positioned above the substrate, a lamp positioned below the substrate, a heater embedded within the substrate support (for example, a pedestal having resistive heating elements embedded therein or coupled thereto), or combinations thereof. Other heat sources are contemplated. In some examples, the substrate is heated using either a ceramic resistive heater and/or using an array of lamps.

A pressure of the processing chamber for operation 940 can be set or maintained at a pressure that is from about 25 mTorr to about 5 Torr, such as from about 50 mTorr to about 2 Torr, such as from about 100 mTorr to about 1.25 Torr, such as from about 200 mTorr to about 1 Torr, such as from about 300 mTorr to about 900 mTorr, such as from about 400 mTorr to about 800 mTorr, such as from about 500 mTorr to about 700 mTorr, such as from about 500 mTorr to about 600 mTorr or from about 600 mTorr to about 700 mTorr. Other temperatures and pressures are contemplated.

The processing time of operation 940 can be about 5 seconds or more and/or about 10 minutes or less, such as from about 15 seconds to about 10 minutes, such as from about 30 seconds to about 5 minutes, such as from about 1 minute to about 4 minutes, such as from about 2 minutes to about 3 minutes, however longer or shorter processing times are contemplated.

During operation 940, the plasma comprising the one or more radical species can be introduced to the processing chamber. The plasma can be flowed through a separation grid, if desired. The plasma can contact one or more sides of a substrate while one or more sides of the substrate are heated. For example, the plasma can contact a first side of the substrate while the substrate is heated using a heat source located on a second side of the substrate. The first side and the second side can be the same or different sides of the substrate. The first side of the substrate can be the side that faces the separation grid when a separation grid is utilized.

Exposure of the substrate to the plasma comprising the one or more radical species in operation 940 enables, for example, the tunability of the nitrogen content and other properties of the substrate or a layer of the substrate being processed. For example, the nitride thickness of the substrate to be adjusted. That is, the substrate (or layer of the substrate) can be made more nitrogen dense by embodiments described herein. After processing the substrate of operation 940, the substrate (or layer of the substrate) can have one or more of the following properties as described below:

A nitride thickness of the substrate (or a layer of the substrate) can be about 25 angstroms (Å) to about 50 Å, such as from about 30 Å to about 40 Å, though larger or smaller values for nitride thickness are contemplated. Nitride thickness is determined by x-ray photoelectron spectroscopy.

A change in nitride thickness of the substrate (or a layer of the substrate) can be about 5 Å to about 50 Å, such as from about 10 Å to about 40 Å, such as from about 20 Å to about 30 Å. Larger or smaller changes in nitride thickness are contemplated. Change in nitride thickness is determined by x-ray photoelectron spectroscopy.

A number of nitrogen atoms per unit area (nitrogen dose) of the substrate (or a layer of the substrate) can be about $5 \times 10^{15}$ atoms/cm$^2$ to about $50 \times 10^{15}$ atoms/cm$^2$, such as from about $10 \times 10^{15}$ atoms/cm$^2$ to about $40 \times 10^{15}$ atoms/cm$^2$, such as from about $15 \times 10^{15}$ atoms/cm$^2$ to about $35 \times 10^{15}$ atoms/cm$^2$, such as from about $20 \times 10^{15}$ atoms/cm$^2$ to about $30 \times 10^{15}$ atoms/cm$^2$. In at least one embodiment, the number of nitrogen atoms per unit area (nitrogen dose) of the substrate (or a layer of the substrate) is from about $10 \times 10^{15}$ atoms/cm$^2$ to about $25 \times 10^{15}$ atoms/cm$^2$, such as from about $12 \times 10^{15}$ atoms/cm$^2$ to about $20 \times 10^{15}$ atoms/cm$^2$, such as from about $14 \times 10^{15}$ atoms/cm$^2$ to about $18 \times 10^{15}$ atoms/cm$^2$, though larger or smaller values are contemplated. The number of nitrogen atoms per unit area is determined by x-ray photoelectron spectroscopy.

A change in number of nitrogen atoms per unit area (nitrogen dose) of the substrate (or a layer of the substrate) can be about $1 \times 10^{15}$ atom/cm$^2$ to about $50 \times 10^{15}$ atoms/cm$^2$, $5 \times 10^{15}$ atoms/cm$^2$ to about $45 \times 10^{15}$ atoms/cm$^2$, such as from about $10 \times 10^{15}$ atoms/cm$^2$ to about $40 \times 10^{15}$ atoms/cm$^2$, such as from about $15 \times 10^{15}$ atoms/cm$^2$ to about $35 \times 10^{15}$ atoms/cm$^2$, such as from about $20 \times 10^{15}$ atoms/cm$^2$ to about $30 \times 10^{15}$ atoms/cm$^2$. In at least one embodiment, the change in number of nitrogen atoms per unit area (nitrogen dose) of the substrate (or a layer of the substrate) is from about $1 \times 10^{15}$ atom/cm$^2$ to about $30 \times 10^{15}$ atoms/cm$^2$, $10 \times 10^{15}$ atoms/cm$^2$ to about $25 \times 10^{15}$ atoms/cm$^2$, such as from about $12 \times 10^{15}$ atoms/cm$^2$ to about $20 \times 10^{15}$ atoms/cm$^2$, such as from about $14 \times 10^{15}$ atoms/cm$^2$ to about $18 \times 10^{15}$ atoms/cm$^2$, though larger or smaller values are contemplated. The change in number of nitrogen atoms per unit area is determined by x-ray photoelectron spectroscopy.

A percent nitrogen content (in units of atomic percent) in the layer of the substrate (or a layer of the substrate) can be about 1% or more and/or about 45% or less, such as from about 3% to about 40%, such as from about 5% to about 35%, such as from about 10% to about 30%, such as from about 15% to about 25%, such as from about 10% to about 20%, based on a total amount of material in the layer or the substrate. Larger or smaller values for the atomic percent of nitrogen are contemplated. The percent nitrogen content is determined by x-ray photoelectron spectroscopy.

A change in percent nitrogen content in the layer of the substrate (or a layer of the substrate) can be about 1% or more and/or about 500% or more, such as from about 50% to about 400%, such as from about 75% to about 200%, such as from about 100% to about 150%. Larger or smaller changes in percent nitrogen content are contemplated. The change in percent nitrogen content is determined by x-ray photoelectron spectroscopy. For example, the nitrogen content can increase by about 1% or more, and/or 50% or less, such as from about 5% to about 45%, such as from about 10% to about 40%, such as from about 15% to about 35%, such as from about 20% to about 30%, based on a total amount of material in the layer or the substrate.

In certain examples, a substrate undergoing the nitridation method can include a layer of silicon oxide having a thickness that is from about 10 angstroms to about 100 angstroms. During silicon oxide nitridation, at least one of diatomic nitrogen (N$_2$), ammonia (NH$_3$), hydrazine, or other nitrogen containing source, or a mixture thereof, is introduced to the plasma processing source to generate N* and/or NH* radicals. The silicon oxide nitridation performed using the plasma processing apparatus and methods of the present disclosure can increase nitrogen content in silicon oxide relative to rapid thermal nitridation processes at approximately the same level of nitrogen conformality. This may be due to nitrogen radicals (for example, N* and/or NH* radicals) being more reactive than NH$_3$ molecules. Moreover, the silicon oxide nitridation processes described herein also increase nitrogen conformality in silicon oxide relative to ion driven decoupled plasma nitridation processes. Silicon oxide nitridation described herein can form peaks in nitrogen content at both the silicon-silicon oxide interface and the silicon oxide surface due to diffusion of N* and/or NH* radicals from the surface to the interface. Furthermore, the silicon oxide nitridation described herein can increase conformality on gate all around (GAA) semiconductor structures. In some examples, nitridation of $SiO_2$ led to a higher nitrogen content, a higher number of nitrogen atoms per unit area, a higher nitride thickness, among other properties when, for example, the method is performed with a greater amount of $N_2$ than the amount of $NH_3$ or hydrazine. In some examples, nitridation of hafnium oxide led to a higher nitrogen content, a higher number of nitrogen atoms per unit area, a higher nitride thickness, among other properties when, for example, the method is performed with a greater amount of $NH_3$ or hydrazine than the amount of $N_2$.

In another example, the plasma processing apparatus of the present disclosure may be used for silicon (Si) nitridation. In certain examples, a substrate undergoing the nitridation method can include a layer of silicon which can be treated with nitrogen radicals to form a conformal layer of silicon nitride (for example, SiN).

The silicon nitridation performed using the plasma processing apparatus and methods of the present disclosure can form a conformal layer of silicon nitride having a thickness that is from about 10 angstroms to about 60 angstroms. In one example, the silicon nitridation described herein enables formation of substantially conformal nitrogen content on top and bottom sidewalls of polysilicon in a 3DNAND channel polysilicon (stack with an aspect ratio from 10:1 to 200:1).

Before, during, and/or after the nitridation of methods 800 and 900 can include a cleaning operation where the substrate (or a layer of the substrate) is pre-cleaned to remove contaminants such as surface oxidation from the layer being subject to nitridation as described herein. Surface cleaning can be performed using wet chemistry such as dilute HF, ammonium hydroxide/peroxide, sulfuric acid/peroxide, and combinations thereof. Cleaning can be performed in the same process chamber as plasma processing described herein using plasma-generated species such as hydrogen radicals and/or oxygen radicals. Additionally, or alternatively, before, during, and/or after nitridation, the substrate can undergo a hydrogen radical treatment and/or an oxygen radical treatment. Cleaning, hydrogen radical treatment, and/or oxygen radical treatment can be performed in the same processing chamber or a different processing chamber as the nitrogen radical treatment (nitridation). Cleaning, nitrogen radical treatment, hydrogen radical treatment, and/or oxygen radical treatment can be performed in a cyclic process.

The methods described herein can be used for silicon nitridation (for example, bare Si nitridation). In addition, the methods described herein can be used for amorphous silicon (a-Si) nitridation. Here, the inventors found that embodiments described herein enable, for example, similar rates of nitridation for both crystalline silicon and amorphous silicon. The nitridation processes described herein can be used with or without a separation grid.

Nitridations using different plasma source power densities were also compared. It was found that a plasma source output (for example, the plasma source interior 125) having a smaller diameter achieves similar or even improved nitride thickness and nitrogen atoms per unit area as compared to larger diameters of the plasma source output. Here, the inventors found that methods described herein can enable, for example, increased nitrogen thickness.

Nitridation of SiO films, such as PECVD oxide films and thermal grown oxide films, were also investigated. The inventors found that embodiments of the nitridation methods described herein can be utilized to increase the nitrogen content of these and other SiO films. In addition, transmission electron microscopy (TEM) measurements were performed to measure nitride thickness on 3DNAND memory holes. The TEM measurements showed that the nitridation described herein can be ≥90% conformal, where the nitride thickness at the top of a memory hole was very close to the nitride thickness at the bottom of the memory hole. Thus, the nitridation methods described herein can be performed on advanced semiconductor structures such as DRAM structures, 3D NAND structures, and high-aspect ratio structures (for example, about 100:1 to about 200:1), among others.

Overall, methods described herein enable nitridation of a variety of substrates. Embodiments of the methods described herein can achieve, for example, a higher nitrogen dose (a higher number of nitrogen atoms per area of the substrate), higher nitride thickness, increased nitride depth, and improved conformality over existing processes.

As is apparent from the foregoing general description and the specific aspects, while forms of the aspects have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a composition, an element or a group of elements is preceded with the transitional phrase "comprising," it is understood that we also contemplate the same composition or group of elements with transitional phrases "consisting essentially of," "consisting of," "selected from the group of consisting of," or "Is" preceding the recitation of the composition, element, or elements and vice versa, e.g., the terms "comprising," "consisting essentially of," "consisting of" also include the product of the combinations of elements listed after the term.

For purposes of this present disclosure, and unless otherwise specified, all numerical values within the detailed description and the claims herein are modified by "about" or "approximately" the indicated value, and consider experimental error and variations that would be expected by a person having ordinary skill in the art. For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited. As used herein, the terms "approximately" or "about" refer to being within at least ±5% of the reference value.

As used herein, the indefinite article "a" or "an" shall mean "at least one" unless specified to the contrary or the context clearly indicates otherwise. For example, aspects comprising "nanotube" include aspects comprising one, two, or more nanotubes, unless specified to the contrary or the context clearly indicates only one nanotube is included.

As used herein, the terms "inner" and "outer"; "up" and "down"; "upper" and "lower"; "top" and "bottom", "vertical" and "horizontal", "upward" and "downward"; "above" and "below"; and other like terms as used herein refer to relative positions to one another and are not intended to denote a particular direction or spatial orientation of the overall source/apparatus.

While the foregoing is directed to embodiments of the present disclosure, other and further embodiments of the disclosure may be devised without departing from the basic scope thereof.

What is claimed is:

1. A method for nitriding a substrate, comprising:
   positioning the substrate on a substrate support in a processing volume of a processing chamber;
   flowing a nitrogen-containing source and a carrier gas into a plasma processing source coupled to the processing chamber such that a flow rate of the nitrogen-containing source is from about 3% to about 20% of a flow rate of the carrier gas;
   generating an inductively-coupled plasma in the plasma processing source by operating an inductively-coupled plasma source at a power of about 2,000 W to about 10,000 W, the inductively-coupled plasma comprising a radical species formed from the nitrogen-containing source, the carrier gas, or both; and
   nitriding the substrate within the processing chamber, comprising:
      operating a heat source within the processing chamber at a temperature of about 150° C. to about 650° C. to heat the substrate;
      maintaining a pressure of the processing chamber of about 50 mTorr to about 2 Torr;
      introducing the inductively-coupled plasma to the processing chamber; and
      adjusting a nitrogen content, a number of nitrogen atoms per unit area, a nitride thickness, or combinations thereof, of the substrate by exposing the substrate to the radical species; and
   performing a hydrogen radical treatment before or after nitriding the substrate.

2. The method of claim 1, wherein $H_2$ is co-flowed with the nitrogen-containing source, and the inductively-coupled plasma further comprises a radical species formed from the $H_2$.

3. The method of claim 1, wherein the plasma processing source comprises:
   a gas injection channel defined between a gas injection insert and a sidewall of the plasma processing source; and
   an induction coil positioned proximate the sidewall and horizontally overlapping the gas injection channel.

4. The method of claim 3, wherein flowing the nitrogen source and the carrier gas into the plasma processing source comprises flowing the nitrogen source and the carrier gas into the gas injection channel.

5. The method of claim 1, wherein the nitrogen-containing source comprises $NH_3$, $N_2$, hydrazine ($N_2H_4$), or combinations thereof.

6. The method of claim 1, wherein the carrier gas comprises Ar, He, Ne, Kr, Xe, or combinations thereof.

7. The method of claim 1, wherein the heat source comprises a lamp positioned above the substrate, a lamp positioned below the substrate, a heater embedded within the substrate support, or combinations thereof.

8. The method of claim 1, wherein the heat source has a plasma source output of about 2 inches in diameter to about 15 inches in diameter.

9. The method of claim 1, wherein the substrate comprises crystalline silicon, amorphous silicon, polycrystalline silicon, crystalline SiGe, amorphous SiGe, polycrystalline SiGe, silicon oxide, silicon nitride, hafnium oxide, hafnium zirconium oxide, or combinations thereof.

10. The method of claim 1, further comprising performing an oxygen radical treatment before or after nitriding the substrate.

11. The method of claim 10, wherein the oxygen radical treatment, the hydrogen radical treatment, or both, are performed in the same processing chamber as nitriding the substrate.

12. A method for nitriding a substrate, comprising:
   positioning the substrate on a substrate support in a processing volume of a processing chamber;
   generating an inductively-coupled plasma in a plasma processing source coupled to the processing chamber, wherein generating the inductively-coupled plasma comprises:
      operating an inductively-coupled plasma source at a power of about 2,000 W to about 10,000 W;
      flowing hydrazine and a carrier gas into the plasma processing source such that a flow rate of the hydrazine is from about 3% to about 100% of a flow rate of the carrier gas, the carrier gas comprising Ar, He, Ne, Kr, Xe, or combinations thereof; and
      forming the inductively-coupled plasma, the inductively-coupled plasma comprising a radical species comprising N, NH, or a combination thereof; and
   nitriding the substrate within the processing chamber, wherein nitriding the substrate comprises:
      operating a heat source within the processing chamber at a temperature of about 150° C. to about 650° C. to heat the substrate;
      maintaining a pressure of the processing chamber of about 50 m Torr to about 2 Torr;
      introducing the inductively-coupled plasma to the processing chamber; and
      adjusting a nitrogen content, a number of nitrogen atoms per unit area, a nitride thickness, or combinations thereof, of the substrate by exposing the substrate to the inductively-coupled plasma comprising the radical species; and
   performing a hydrogen radical treatment before or after nitriding the substrate.

13. The method of claim 12, wherein the flow rate of the hydrazine is from about 5% to about 15% of the flow rate of the carrier gas.

14. The method of claim 12, wherein:
   the pressure is from about 200 m Torr to about 1 Torr;
   the temperature is from about 500° C. to about 650° C.;
   nitriding the substrate is performed for about 5 minutes or less; or
   combinations thereof.

15. The method of claim 12, wherein the heat source has a plasma source output of about 4 inches in diameter to about 15 inches in diameter.

16. The method of claim 12, wherein;
   $H_2$ is co-flowed with the hydrazine and the inductively-coupled plasma further comprises a radical species formed from the $H_2$;
   $NH_3$, $N_2$, or a combination thereof is co-flowed with the hydrazine and the inductively-coupled plasma further comprises a radical species formed from the NH$_3$, N$_2$, or a combination thereof; or a combination thereof.

17. A method for nitriding a substrate, comprising:
positioning the substrate on a substrate support in a processing volume of a processing chamber, the substrate comprising silicon;
generating an inductively-coupled plasma in a plasma processing source coupled to the processing chamber, wherein generating the inductively-coupled plasma comprises:
   operating an inductively-coupled plasma source at a power of 2,000 W to 10,000 W;
   flowing a nitrogen-containing source and a carrier gas into the plasma processing source such that a flow rate of the a nitrogen-containing source is from about 3% to 100% of a flow rate of the carrier gas, the carrier gas comprising Ar, He, Ne, Kr, Xe, or combinations thereof; and
   forming the inductively-coupled plasma, the inductively-coupled plasma comprising a radical species comprising N, NH, or a combination thereof; and
nitriding the substrate within the processing chamber, wherein nitriding the substrate comprises:
   operating a heat source within the processing chamber at a temperature from about 150° C. to about 650° C. to heat the substrate;
   maintaining a pressure of the processing chamber from about 50 mTorr to about 2 Torr;
   introducing the inductively-coupled plasma to the processing chamber; and
   adjusting a nitrogen content, a number of nitrogen atoms per unit area, a nitride thickness, or combinations thereof, of the substrate by exposing the substrate to the inductively-coupled plasma comprising the radical species; and
performing a hydrogen radical treatment before or after nitriding the substrate.

18. The method of claim 17, wherein the substrate comprises silicon germanium (SiGe).

19. The method of claim 17, wherein:
the flow rate of the nitrogen-containing source is from about 5% to about 15% of the flow rate of the carrier gas;
the pressure is from about 200 m Torr to about 1 Torr;
the temperature is from about 500° C. to about 650° C.;
nitriding the substrate is performed for about 10 minutes or less; or
combinations thereof.

20. The method of claim 17, wherein:
H$_2$ is co-flowed with the nitrogen-containing source and the inductively-coupled plasma further comprises a radical species formed from the H$_2$;
the plasma processing source is integrated within the processing chamber; or
a combination thereof.

* * * * *